US009116197B2

(12) United States Patent
Lorenz et al.

(10) Patent No.: US 9,116,197 B2
(45) Date of Patent: Aug. 25, 2015

(54) INTEGRATED INTERCONNECT AND MAGNETIC-FIELD DETECTOR FOR CURRENT SENSING

(75) Inventors: Robert Donald Lorenz, Madison, WI (US); Jonathan David Hoffman, Madison, WI (US); Patrick Erik Schneider, Raleigh, NC (US)

(73) Assignee: Wisconsin Alumni Research Foundation, Madison, WI (US)

( * ) Notice: Subject to any disclaimer, the term of this patent is extended or adjusted under 35 U.S.C. 154(b) by 467 days.

(21) Appl. No.: 13/546,620

(22) Filed: Jul. 11, 2012

(65) Prior Publication Data

US 2014/0015524 A1  Jan. 16, 2014

(51) Int. Cl.
*G01R 33/09* (2006.01)

(52) U.S. Cl.
CPC ........................................ *G01R 33/09* (2013.01)

(58) Field of Classification Search
CPC ...... G01R 33/09; G01R 15/205; G01R 33/096
USPC ............... 324/244, 252; 439/66, 71, 862, 482
See application file for complete search history.

(56) References Cited

U.S. PATENT DOCUMENTS 6,734,660 B1 * 5/2004 Berkcan et al. ........... 324/117 R
2004/0152292 A1   8/2004 Babinetz et al.
2005/0042855 A1   2/2005 Ano
2009/0140733 A1 * 6/2009 Koga et al. .................... 324/252
2012/0025617 A1   2/2012 Mateicka et al.

OTHER PUBLICATIONS

NPL from IDS Basics Downloaded from http://www.semikron.com/skcompub/en/eng_1 5 2-1_6.pdf on Apr. 17, 2012, Semikron, pp. 90-96.*
Caruso et al., A New Perspective on Magnetic Field Sensing, May 1998, Honeywell, Inc., pp. 1-19.
Basics, Downloaded from http://www.semikron.com/skcompub/en/eng_1_5_2-1_6.pdf on Apr. 17, 2012, Semikron, pp. 90-96.
Application Notes for GMR Sensors, NVE Corporation, Downloaded from http://www.nve.com/Downloads/apps.pdf on Apr. 17, 2012, pp. 78-130.

* cited by examiner

*Primary Examiner* — Arleen M Vazquez
*Assistant Examiner* — Brent J Andrews
(74) *Attorney, Agent, or Firm* — Bell & Manning, LLC

(57) ABSTRACT

A device is provided. The device may include a first electrical connector, a second electrical connector, an interconnect, and a magnetic field detector. The interconnect is mounted in electrical contact with the first electrical connector and the second electrical connector and includes a loop. The magnetic field detector is located in proximity to the loop of the interconnect. The magnetic field detector is located to detect a current flowing in the interconnect when the current flows in the interconnect.

20 Claims, 34 Drawing Sheets

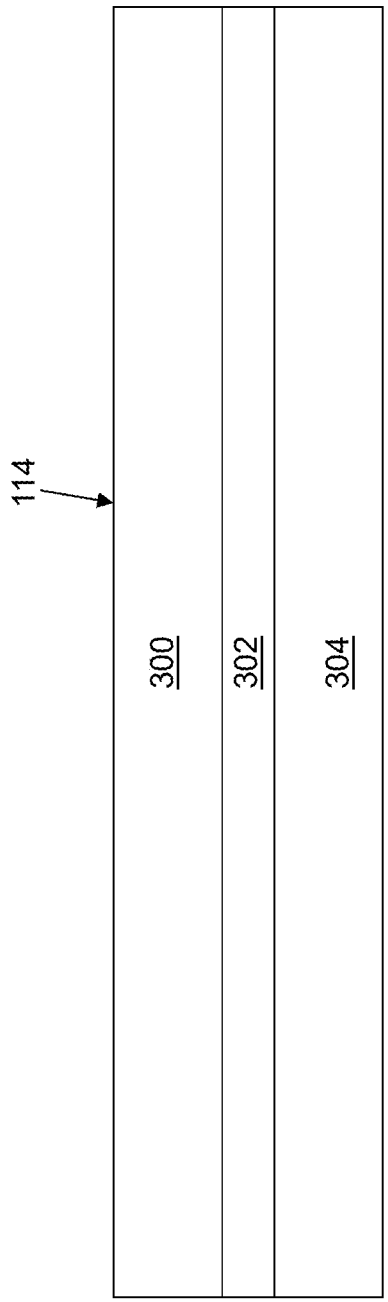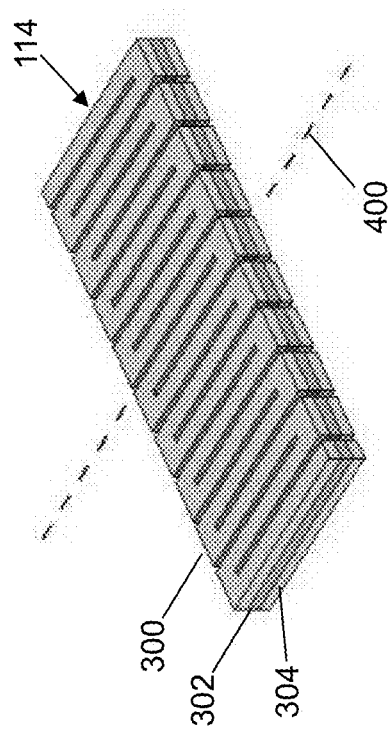
Fig. 3
Fig. 4

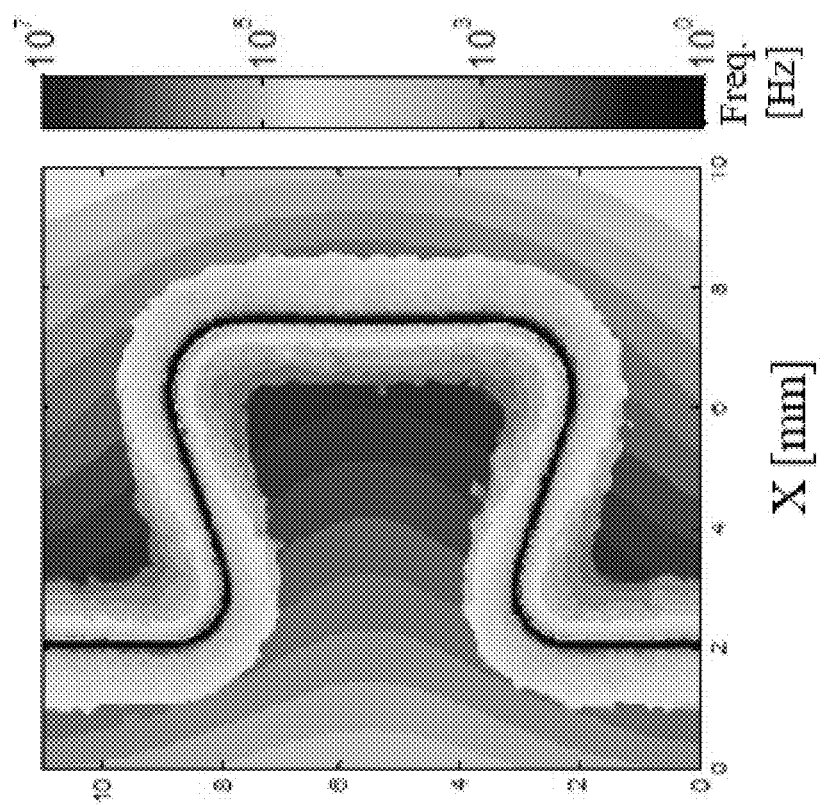
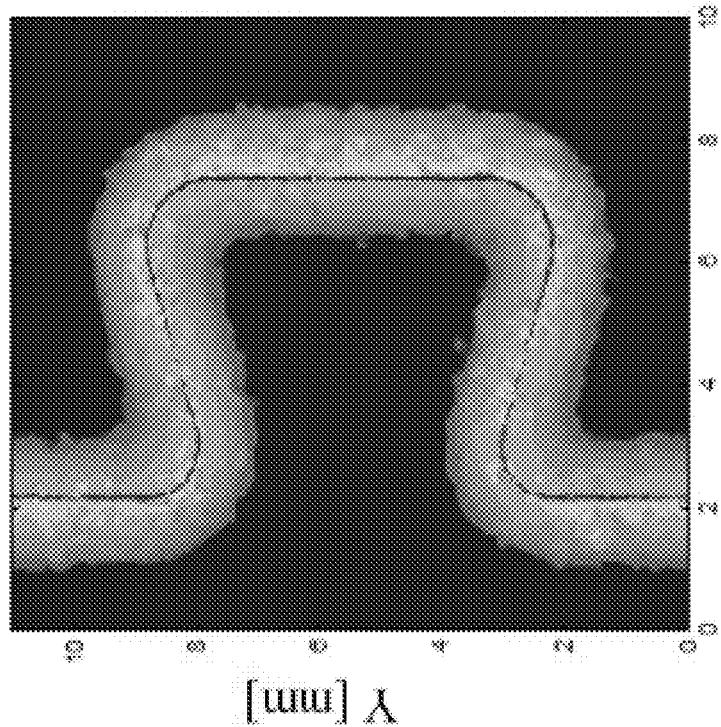
Fig. 13b
Fig. 13a

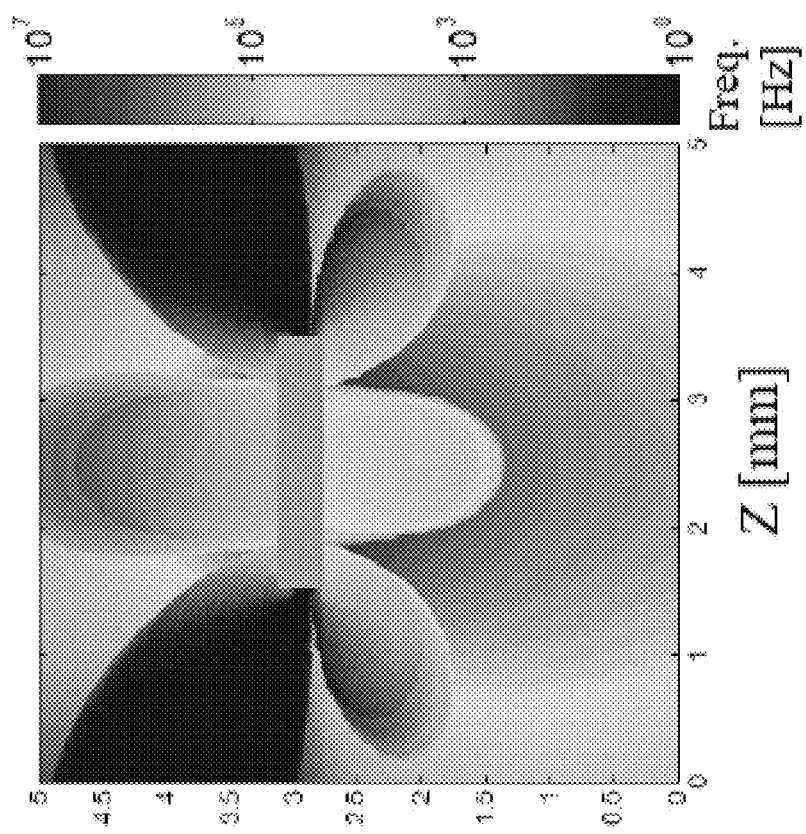
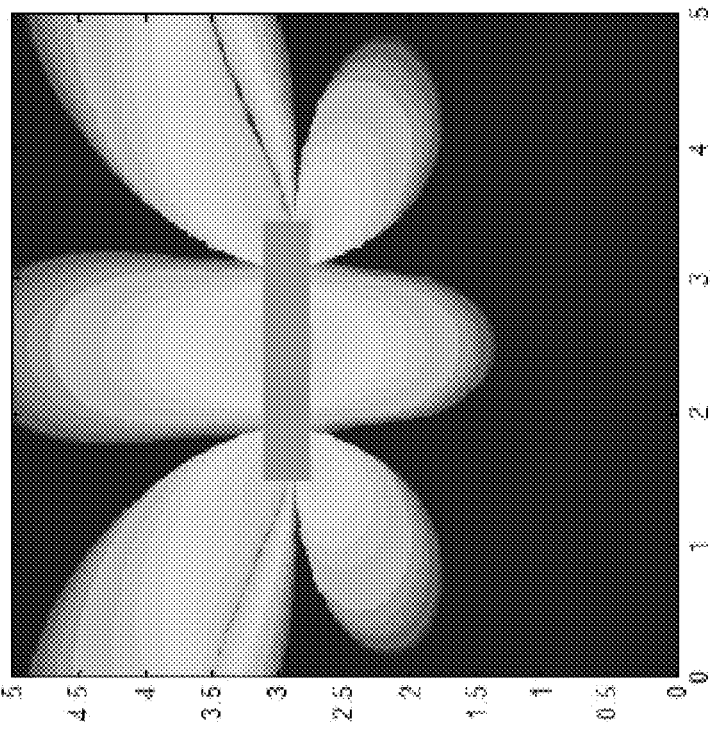
Fig. 14b
Fig. 14a

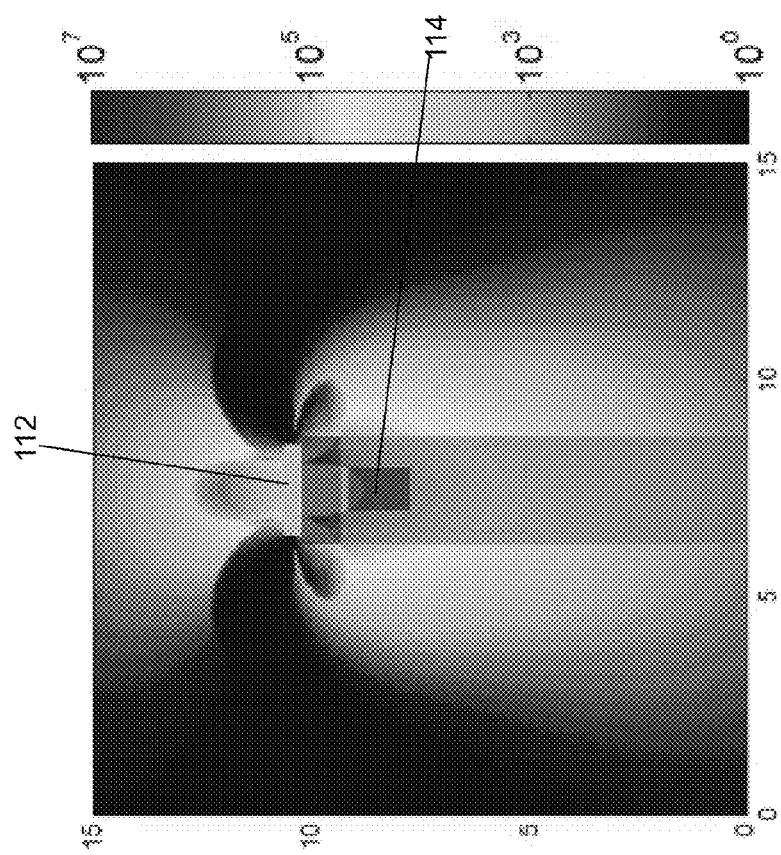
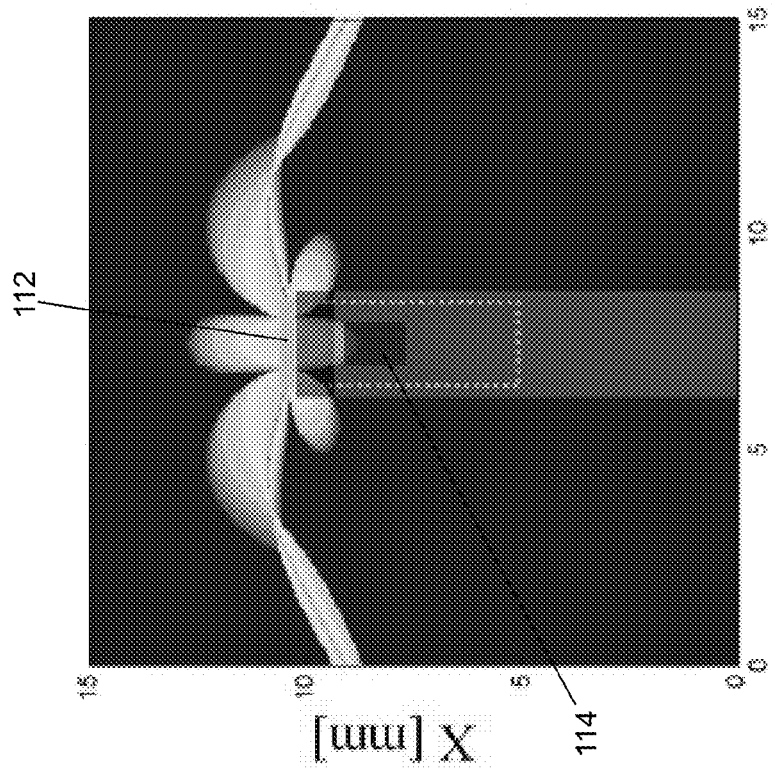
Fig. 15b
Fig. 15a

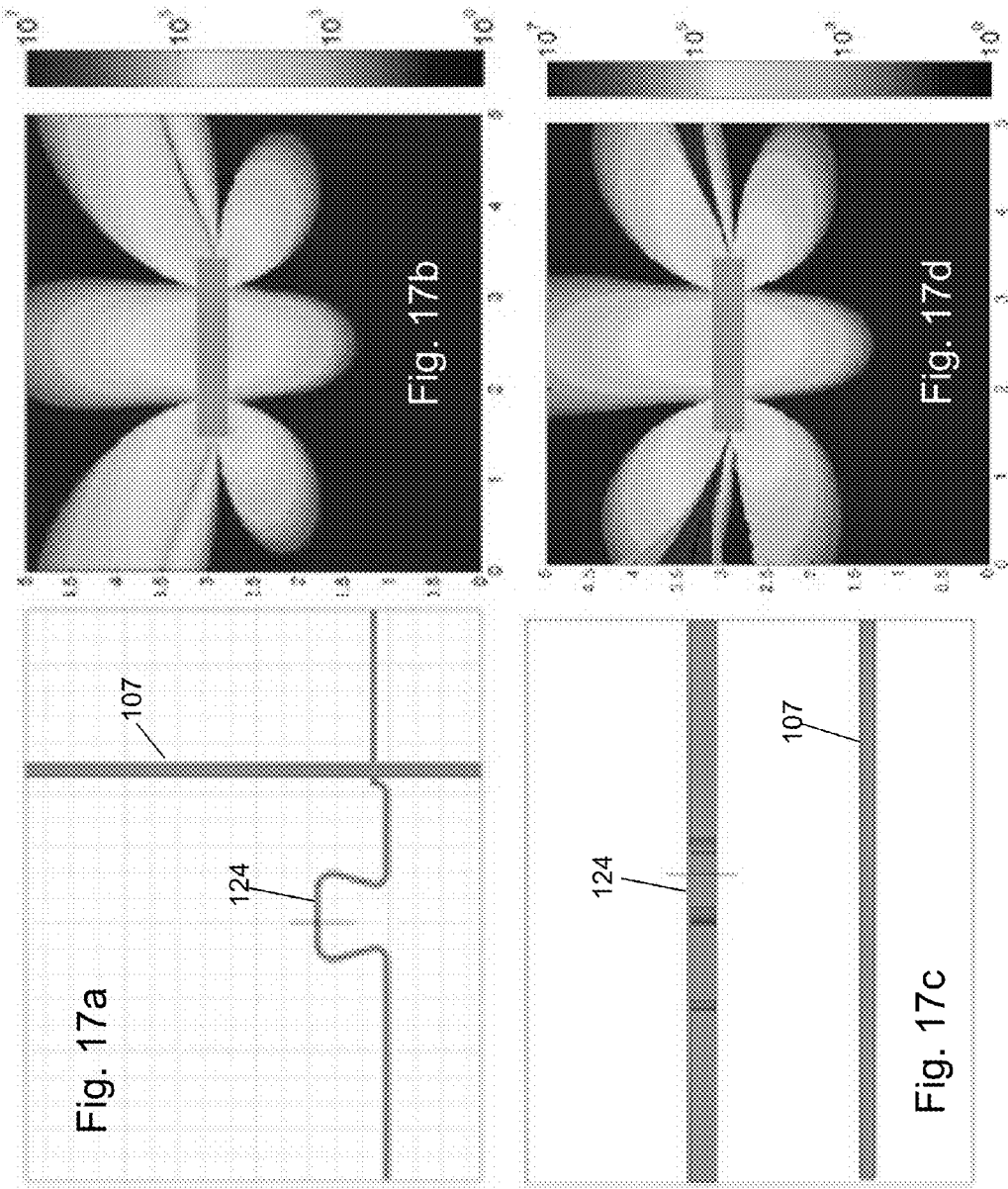

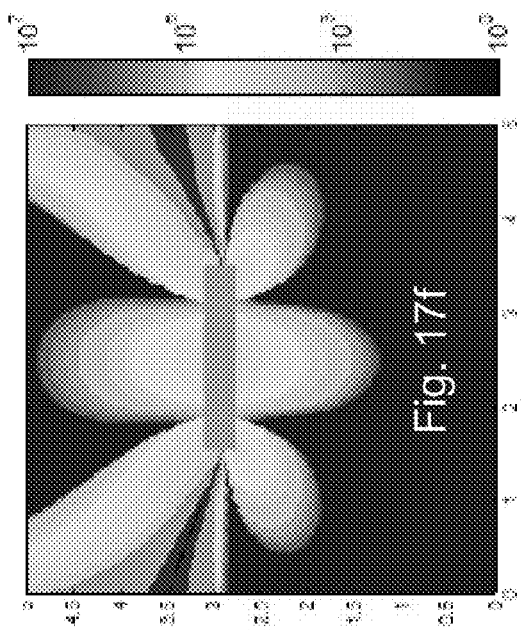
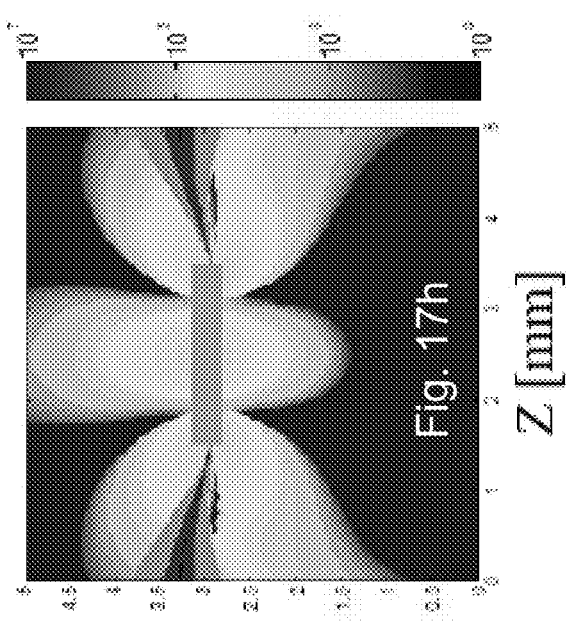
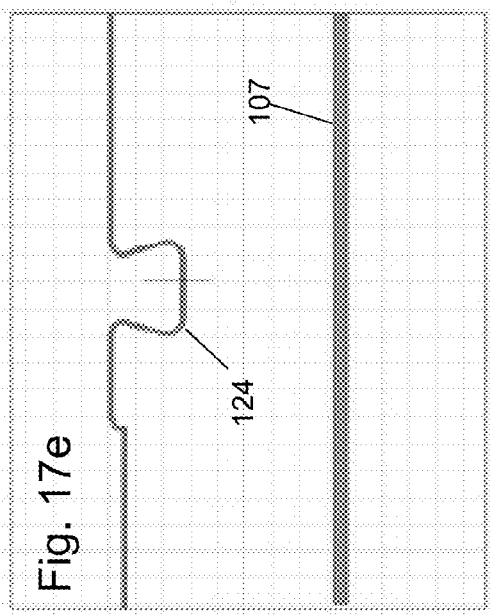
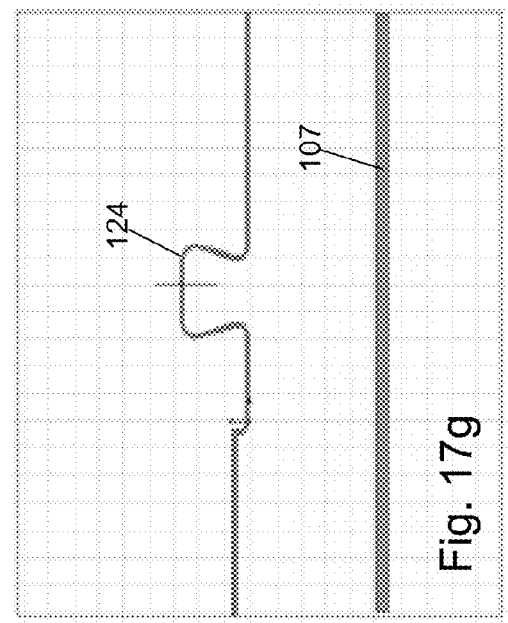

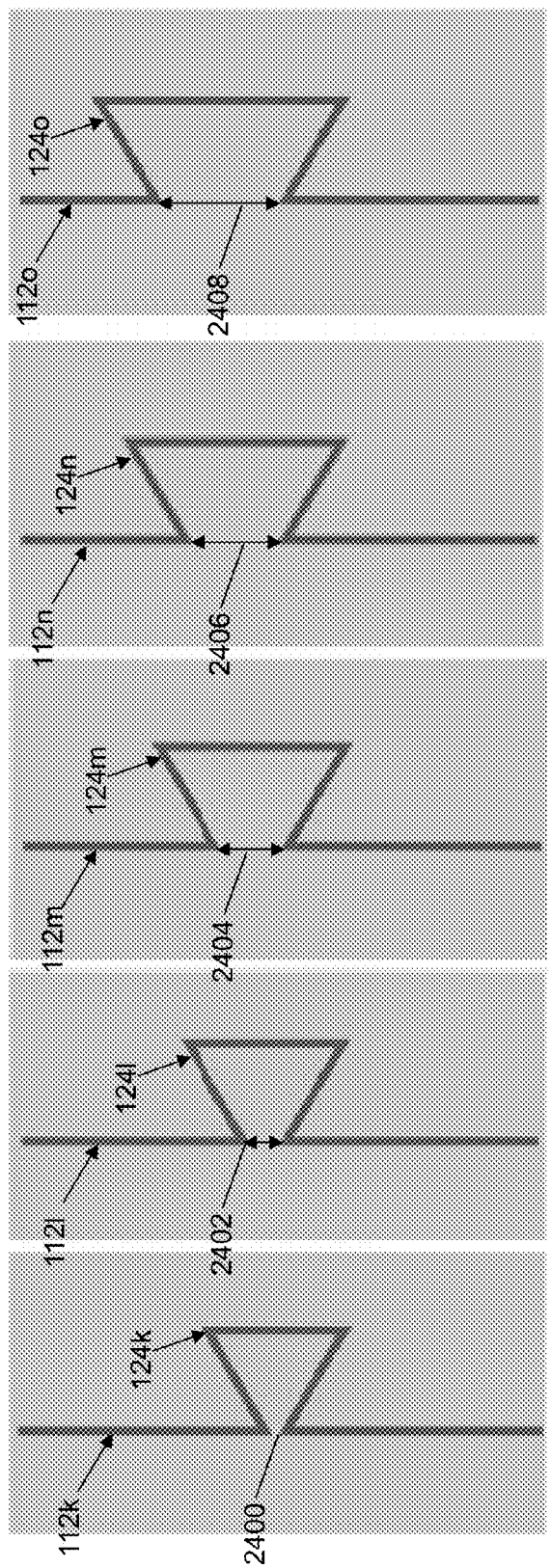

INTEGRATED INTERCONNECT AND MAGNETIC-FIELD DETECTOR FOR CURRENT SENSING

BACKGROUND

Semiconductors are used to regulate power flow in many modern electronic devices, including many applications in energy conversion. Interconnects are used to integrate the chips, substrates, and terminals in these semiconductor devices. For example, interconnects interface a semiconductor chip with a surrounding direct bond copper substrate (DBC) and interface the DBC substrate with external terminals. There are numerous techniques in common usage for forming the electrical interconnects. One of the oldest and still most common techniques is a straight wire or lead frame that is bonded at the connection points.

Interconnect failure is responsible for approximately 75% of all failures in semiconductor devices. These failures are usually a result of thermally induced mechanical fatigue. Conventional solutions for increasing semiconductor device interconnect reliability exist in many forms. Some designs focus on improving cyclic thermal strain, and others focus on interconnect design optimization for minimum parasitic inductance.

Modern semiconductor devices are moving towards increasingly integrated functionality. One of the most fundamental and useful integrated functions is that of current sensing. There are many types of commercially available current sensors today; however, each has significant barriers to integration. For example, LEM sensors are expensive, take up a lot of area, and are fairly low bandwidth.

SUMMARY

In an example embodiment, a device is provided. The device may include a first electrical connector, a second electrical connector, an interconnect, and a magnetic field detector. The interconnect is mounted in electrical contact with the first electrical connector and the second electrical connector and includes a loop. The magnetic field detector is located in proximity to the loop of the interconnect. The magnetic field detector is located to detect a current flowing in the interconnect when the current flows in the interconnect.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 3 depicts a side view of a magnetic field detector of the device of FIG. 1 in accordance with an illustrative embodiment.

FIG. 4 depicts an isometric projection of a serpentine construction for a magnetic field detector of FIG. 3 in accordance with an illustrative embodiment.

FIG. 13a depicts a XY plane $H_z$ field 5% FBW of the interconnect of FIG. 2 in accordance with an illustrative embodiment.

FIG. 13b depicts a XY plane $H_z$ FWFBW of the interconnect of FIG. 2 in accordance with an illustrative embodiment.

FIG. 14a depicts a XZ plane $H_z$ field 5% FBW of the interconnect of FIG. 2 in accordance with an illustrative embodiment.

FIG. 14b depicts a XZ plane $H_z$ FWFBW of the interconnect of FIG. 2 in accordance with an illustrative embodiment.

FIG. 15a depicts a XZ plane $H_z$ field 5% FBW of the interconnect of FIG. 2 with the magnetic field detector of FIG. 3 in a first orientation in accordance with an illustrative embodiment.

FIG. 15b depicts a XZ plane $H_z$ FWFBW of the interconnect of FIG. 2 with the magnetic field detector of FIG. 3 in the first orientation in accordance with an illustrative embodiment.

FIGS. 17a-17h depict a XZ plane $H_z$ 5% FBW of the interconnect of FIG. 2 with a DBC substrate of FIG. 1 in four different orientations with respect to the interconnect of FIG. 2 in accordance with an illustrative embodiment.

FIGS. 24a-24e depict five additional modifications to the interconnect of FIG. 2 in accordance with illustrative embodiments.

DETAILED DESCRIPTION

Figure 1:
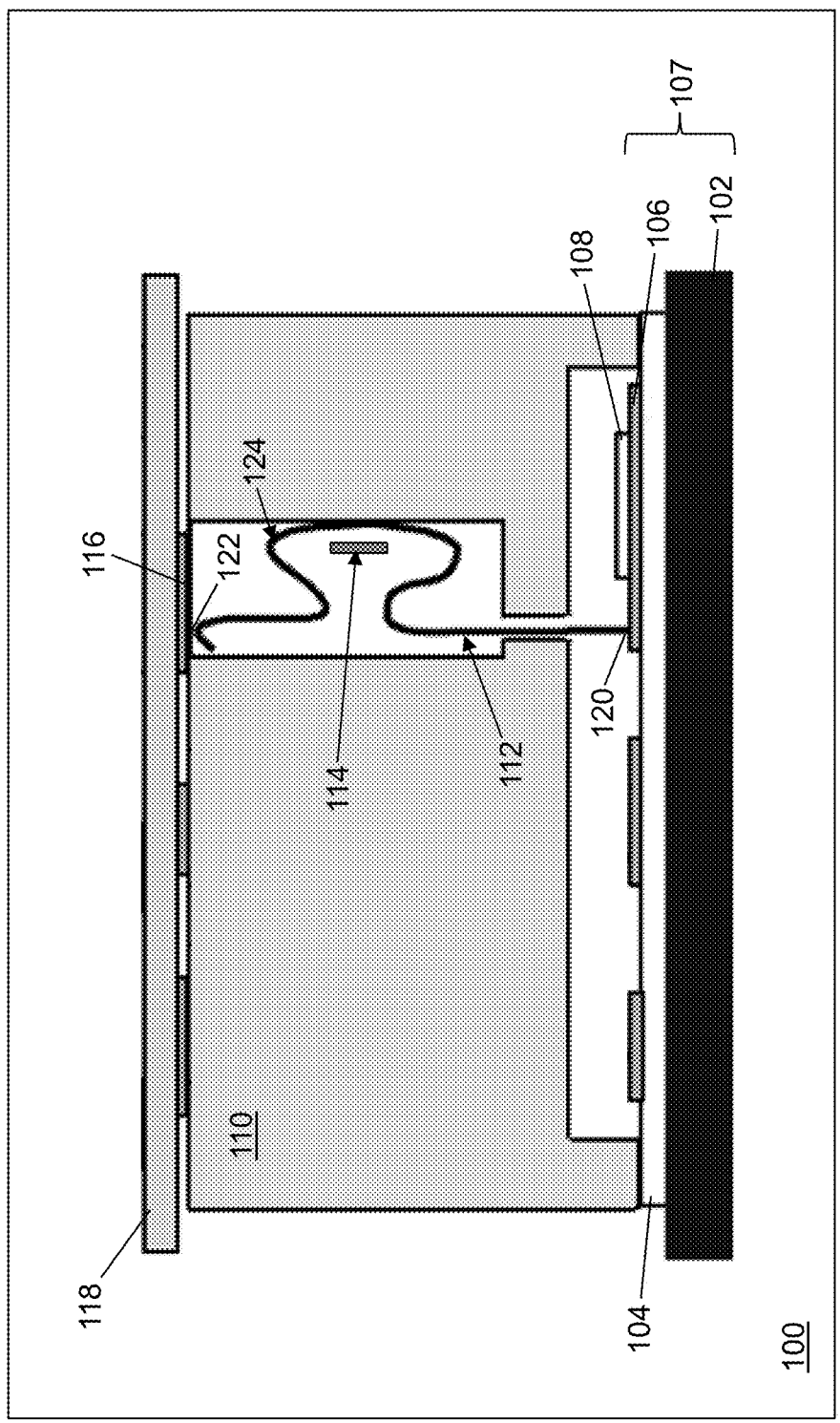
FIG. 1 depicts a side view of a device in accordance with an illustrative embodiment.

With reference to FIG. 1, a side view of a device 100 is shown in accordance with an illustrative embodiment. In the illustrative embodiment, device 100 may include a heat sink 102, a direct bond copper (DBC) isolation substrate 104, a first copper substrate 106, an electronic circuit chip 108, a case 110, an interconnect 112, a magnetic field detector 114, a second copper substrate 116, and a printed circuit board (PCB) 118. Device 100 may include any type of integrated circuit, Heat sink 102, DBC isolation substrate 104, and first copper substrate 106 form a DBC substrate 107. DBC isolation substrate 104 is formed between heat sink 102 and first copper substrate 106.

DBC isolation substrate 104 may be formed of a ceramic tile of alumina in an illustrative embodiment. First copper substrate 106 may be bonded to a side of DBC isolation substrate 104, for example, using a high-temperature oxidation process. First copper substrate 106 may be preformed prior to heating or chemically etched using printed circuit board technology to form an electrical circuit. DBC isolation substrate 104 is mounted to heat sink 102.

In power electronics, DBC substrate 107 provides the interconnections to form an electric circuit and to cool the components of device 100. DBC substrate 107 may be formed using a variety of materials and techniques depending on the application environment of device 100. For example, different materials may be used in a low current and voltage environment as opposed to those used in a high current and voltage and possibly high temperature environment as understood by a person of skill in the art. An insulated metal substrate may be used instead of DBC substrate 107 depending on the application of device 100 in terms of thermal conductivity.

Electronic circuit chip 108 may be composed of a variety of electrical circuit components and configured to perform various functions depending on the application of device 100. For example, if device 100 is used in a power electronics module, electronic circuit chip 108 may include an insulated gate bipolar transistor, a metal oxide semiconductor field effect transistor, a resistor, a capacitor, an inductor, a diode, a transistor, a thyristor, a sensor, etc.

Case 110 may enclose all or parts of device 100 to protect the enclosed parts from an environment and to maintain a relative position between the components of device 100. In an illustrative embodiment, case 110 may be formed of a plastic material.

Second copper substrate 116 may be bonded to a side of PCB 118. First copper substrate 106 and second copper substrate 116 form contact pads for interconnect 112. Thus, interconnect 112 may be bonded or pressed between first copper substrate 106 and second copper substrate 116 to provide the electrical connection between electronic circuit chip 108 and PCB 118 and between DBC substrate 107 and PCB 118. In an illustrative embodiment, first copper substrate 106 and second copper substrate 116 may be formed of copper or gold-clad copper.

Similar to electronic circuit chip 108, PCB 118 may be composed of a variety of electrical circuit components and configured to perform various functions depending on the application of device 100. For example, PCB 118 may include various resistors, capacitors, inductors, diodes, transistors, sensors, etc. connected to perform a variety of functions.

In the illustrative embodiment, interconnect 112 provides an electrical connection between DBC substrate 107 and PCB 118. Interconnect 112 may be formed, for example, of gold, copper, aluminum, and alloys thereof. Interconnect 112 may be used to transfer power, gate, and sense signals between electronic circuit chip 108 and PCB 118 and/or between DBC substrate 107 and PCB 118. In alternative embodiments, interconnect 112 further could be used to connect DBC substrate 107 to electronic circuit chip 108 or otherwise integrated in any integrated circuit between components of the integrated circuit for which a current flowing between the components is to be sensed. Of course, device 100 may include a plurality of interconnects. Interconnect 112 mounts to first copper substrate 106 at a first end 120. Interconnect 112 mounts to second copper substrate 116 at a second end 122. Interconnect 112 includes a loop 124 formed in interconnect 112 between first end 120 and second end 122. Loop 124 provides mechanical strain relief and field shaping.

Figure 2:
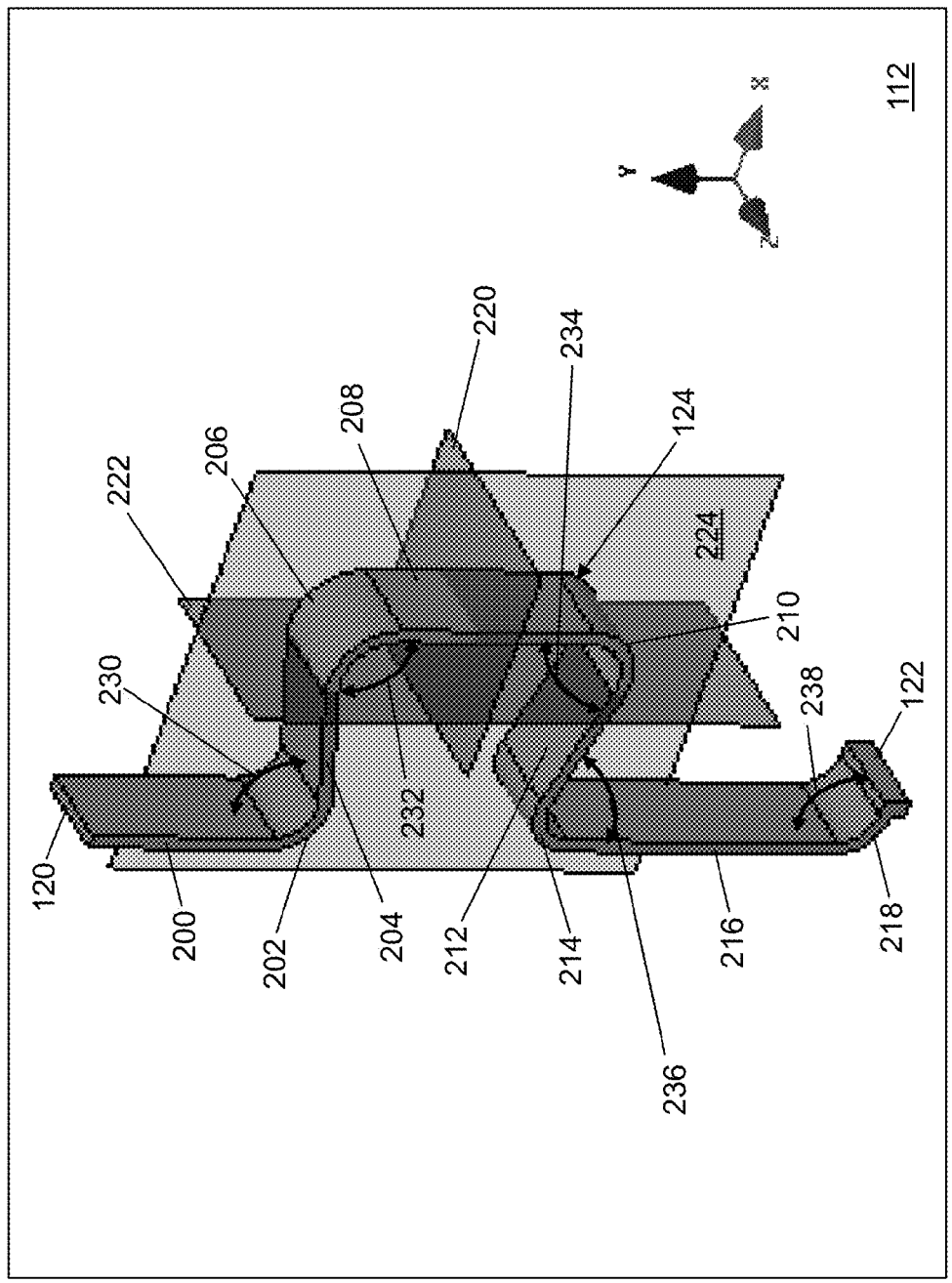
FIG. 2 depicts a side view of an interconnect of the device of FIG. 1 in accordance with an illustrative embodiment.

With reference to FIG. 2, interconnect 112 is shown in accordance with an illustrative embodiment. In the illustrative embodiment, interconnect 112 may include first end 120, a first straight segment 200, a first curved segment 202, a second straight segment 204, a second curved segment 206, a third straight segment 208, a third curved segment 210, a fourth straight segment 212, a fourth curved segment 214, a fifth straight segment 216, a fifth curved segment 218, and second end 122. Second straight segment 204, second curved segment 206, third straight segment 208, third curved segment 210, and fourth straight segment 212 form loop 124. Loop 124 may not include second straight segment 204, third straight segment 208, or fourth straight segment 212 such that loop 124 continuously curves between first curved segment 202 and fourth curved segment 214. Loop 124 further may be formed of a fewer or a greater number of curved and straight segments.

First straight segment 200 extends from first end 120. First curved segment 202 extends between first straight segment 200 and second straight segment 204 and provides a first transition angle 230 between the direction of extension of first straight segment 200 and the direction of extension of second straight segment 204. In an illustrative embodiment, first transition angle 230 is less than 90°. Second curved segment 206 extends between second straight segment 204 and third straight segment 208 and provides a second transition angle 232 between the direction of extension of second straight segment 204 and the direction of extension of third straight segment 208. In an illustrative embodiment, second transition angle 232 is less than 90°. Third curved segment 210 extends between third straight segment 208 and fourth straight segment 212 and provides a third transition angle 234 between the direction of extension of third straight segment 208 and the direction of extension of fourth straight segment 212. In an illustrative embodiment, third transition angle 234 is less than 90°. Fourth curved segment 214 extends between fourth straight segment 212 and fifth straight segment 216 and provides a fourth transition angle 236 between the direction of extension of fourth straight segment 212 and the direction of extension of fifth straight segment 216. In an illustrative embodiment, fourth transition angle 236 is less than 90°. Fifth curved segment 218 extends between fifth straight segment 216 and second end 122 and provides a fifth transition angle 238 between the direction of extension of fifth straight segment 216 and the direction of extension of second end 122. In an alternative embodiment, interconnect 112 may not include fifth curved segment 218, which forms a hook at second end 122, resulting in fifth straight segment 216 extending from second end 122 in a manner similar to the extension of first straight segment 200 from first end 120.

A magnetic field is formed by a current flowing through interconnect 112 dependent on the shape of interconnect 122. Thus, the characteristics of the shape of interconnect 112 can be used for field shaping. The magnetic field can be defined in three planes included in FIG. 2 for reference. An XZ plane 220 is centered in loop 124 through third straight segment 208. A YZ plane 222 contains a center point of the radii of second curved segment 206 and third curved segment 210 in loop 124. An XY plane 224 extends along an edge of interconnect 112. XZ plane 220, YZ plane 222, and XY plane 224 are orthogonal to each other.

With continuing reference to FIG. 1, magnetic field detector 114 is configured to detect the presence, strength, and/or direction of a magnetic field generated from an electric current flowing through interconnect 112 between, for example, DBC substrate 107 and PCB 118. Of course, magnetic field detector 114 may further detect other current flowing through device 100. Magnetic field detector 114 may directly detect the magnetic field rather than the rate of change of the magnetic field, and therefore, be useful as a DC field sensor. Thus, magnetic field detector 114 may be configured to provide a high bandwidth (DC to MHz) current and/or temperature measurements in a small area (i.e., 1.26 mm$^2$). Magnetic field detector 114 detects incident magnetic fields, and because the spatial magnetic field from current carrying conductors is dependent on frequency, a precise 5% flat bandwidth (FBW) metric may be used to evaluate placement of magnetic field detector 114 relative to interconnect 112.

In an illustrative embodiment, magnetic field detector 114 is a giant magnetoresistive (GMR) detector. For example, with reference to FIG. 3, magnetic field detector 114 is implemented as a GMR detector. In the illustrative embodiment of FIG. 3, magnetic field detector 114 is formed of a top film 300, a conductive interlayer 302, and a bottom film 304. Top film 300 is formed of a magnetic material, conductive interlayer 302 is formed of a non-magnetic material, and bottom film 304 is formed of a magnetic material. The GMR phenomenon is an effect found in metallic thin films consisting of magnetic layers a few nanometers or less thick separated by equally thin nonmagnetic layers. GMR detectors are manufactured with very thin layers of alternating magnetic and non-magnetic materials to allow magnetic modulation of the electron spin in the materials. The spin dependence of conduction electrons in magnetic materials, along with the increasing resistivity at very small material thicknesses combines to make the GMR effect possible.

For use in sensors, sandwich material may be patterned into narrow stripes. The initial magnetizations of top film 300 and bottom film 304 are aligned antiparallel. Layer magnetizations are aligned parallel as a result of exposure to a magnetic field, and as a function of field strength. A quantum mechanical effect called spin dependent scattering results in lower resistance for parallel alignment than antiparallel alignment (parallel with opposite direction). GMR=$\Delta R/R_0$, where $\Delta R$ is the change in resistance, and $R_0$ is the initial resistance with zero applied fields. Commercially available GMR field detectors typically have a GMR of 10 to 20%.

If top film 300, conductive interlayer 302, and bottom film 304 are extremely thin (i.e. <10 nanometers), response to frequencies up to 100 megahertz is possible. Bipolar ac current may be rectified by the GMR detectors omnipolar sensitivity unless a method is used to bias the sensor away from zero. Unipolar and pulsed currents can be measured with good reproduction of fast rise time components due to the excellent high frequency response of GMR detectors.

The first consideration when using a GMR detector as a point field sensor is alignment of its axis of sensitivity. The magnetic field sensed should have the same orientation as the GMR detector current. To increase the series resistance of the GMR detector and $\Delta R$, a serpentine configuration may be used as shown with reference to FIG. 4, which illustrates an axis of sensitivity 400. Axis of sensitivity 400 correlates to the orientation of maximum current path length. The GMR effect does not depend on polarity of field, only orientation, which means that the switching of current direction with respect to field polarity as current flows back and forth through the pattern does not negate the GMR effect, but increases R and $\Delta R$.

Because the GMR detector is most sensitive to one orientation of H field, the orientation chosen for the sensor should be carefully considered. When placing a GMR detector to sense the field surrounding a current carrying conductor, such as interconnect 112, it is possible to orient the GMR detector such that no field is measured. This also means that, as a current sensor, axis of sensitivity 400 of the current is perpendicular to an axis of field sensitivity.

Figure 5:
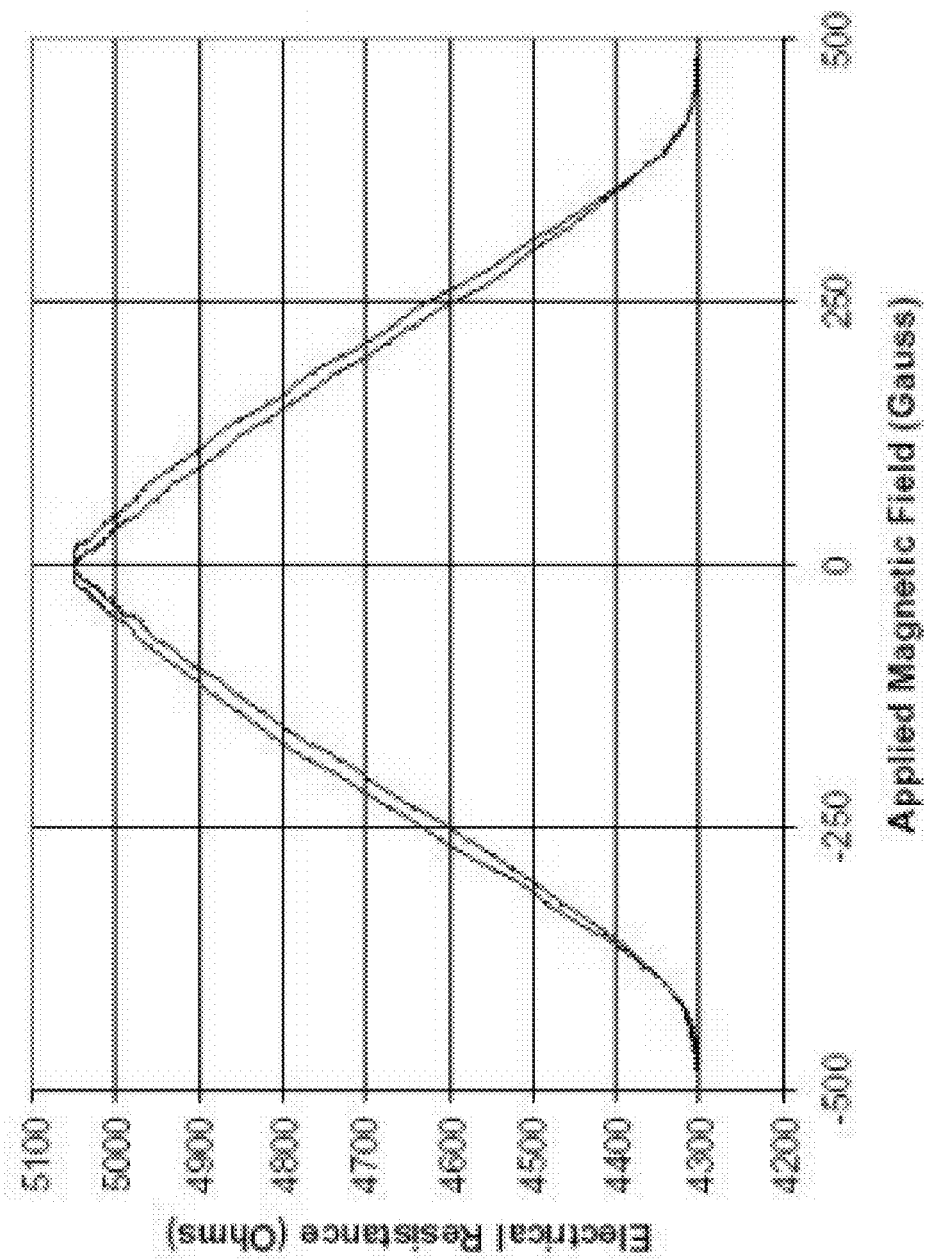
FIG. 5 depicts a resistance of the magnetic field detector of FIG. 3 as a function of applied magnetic field in accordance with an illustrative embodiment.

As mentioned previously, the GMR effect on resistance is not dependent on field polarity. As a result, the GMR detector exhibits a unipolar response to an applied magnetic field. With reference to FIG. 5, a response of a serpentine GMR detector as illustrated in FIG. 4 to a positive and a negative field is shown. Serpentine GMR detector exhibits a resistance symmetry about zero applied field and a linear region in the vicinity around zero. A unipolar response causes a sinusoidal current or subsequent field to appear rectified in the GMR detector output. With the use of a field bias, it is possible to shift a sinusoidal field so that the total field does not cross zero. There are multiple methods for creating the field bias to support bipolar field and current sensing as understood by a person of skill in the art.

In some environments, a single serpentine GMR detector may not be used due to its high temperature dependence. A Wheatstone bridge can be used to negate the temperature dependence of the GMR detector as understood by a person of skill in the art. In a Wheatstone bridge arrangement, two of four GMR detectors are shielded by a permeable material, making them insensitive to an external field. A resistance of all four of the GMR detectors varies with temperature, but only two vary with field strength, which results in a decoupling of the temperature dependence. The two GMRs that detect the field may be placed as close as possible so that they measure the same field. If there is a difference in field strength exposed to the two detectors, the output voltage represents the mean of the magnetic field intensity.

Field biasing used to obtain a bipolar voltage output also reduces the total linear range of the GMR detector by half. The linear region of operation is also not perfectly linear, which means that if a smaller measurement range is chosen the result is higher linearity. A smaller range leads to higher linearity and a smaller range to resolution ratio. The range to resolution is the current range to the voltage output resolution. By varying the distance between the GMR detector (magnetic field detector 114) and the conductor (interconnect 112), the range can be manipulated. The resolution is related to the signal magnitude compared to the noise magnitude. All of these factors should be considered when choosing the amplitude of field biasing and detector positioning. The range to resolution depends on the signal magnitude and noise magnitude. To achieve better resolution during analog to digital conversion, the GMR output may be amplified. The noise magnitude is strongly dependent on detector environment, as well as the amplifier design.

Figure 6:
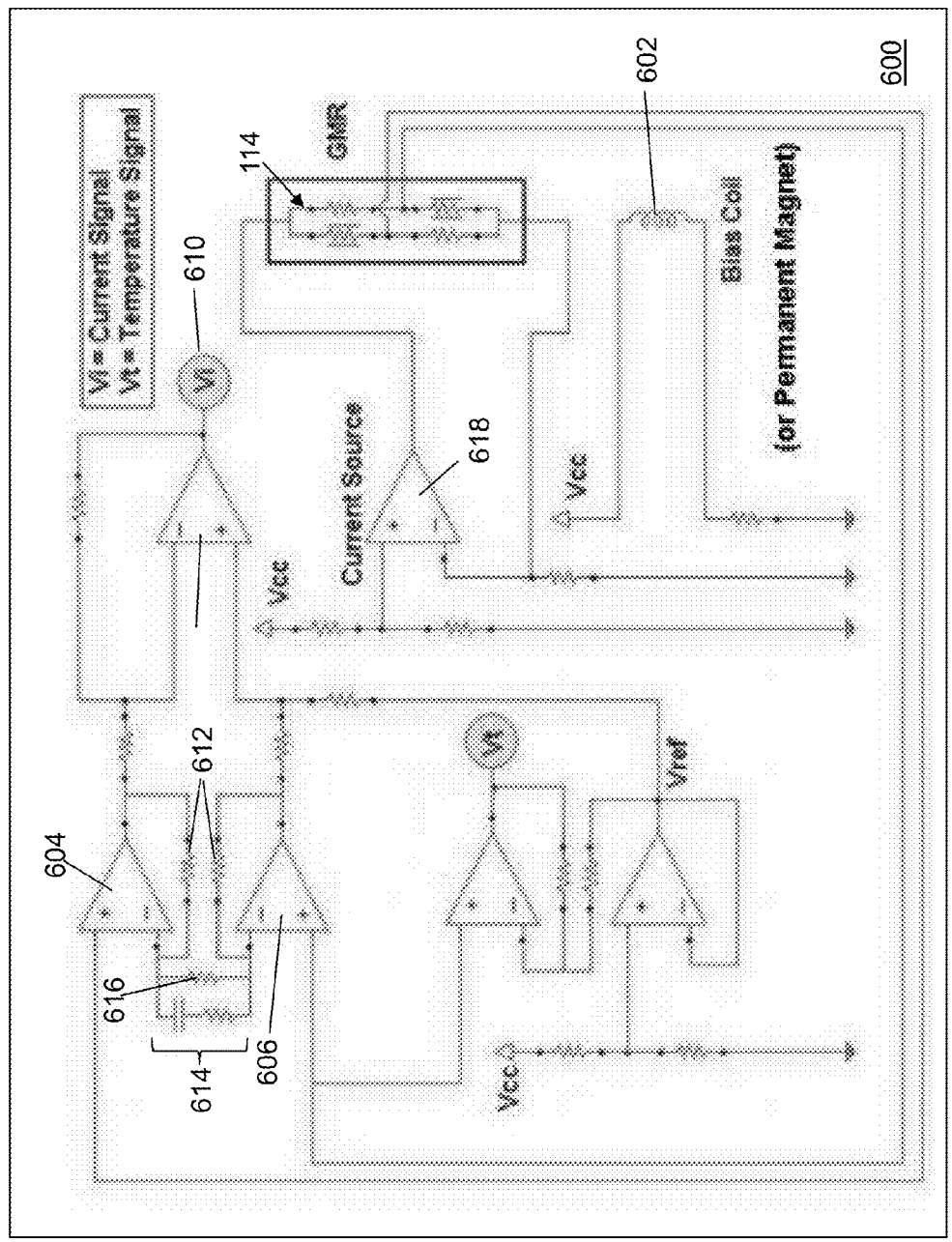
FIG. 6 depicts a schematic of a signal conditioning circuit incorporating the magnetic field detector of FIG. 3 to simultaneously measure current and temperature in accordance with an illustrative embodiment.

With reference to FIG. 6, a GMR circuit 600 provides GMR source and signal conditioning and provides simultaneous current and temperature measurements in accordance with an illustrative embodiment. GMR circuit 600 includes magnetic field detector 114, a bias coil 602, a first buffer amplifier 604, a second buffer amplifier 606, a differential amplifier 608, and a current source 618 to provide a current output 610. In an alternative embodiment, bias coil 116 may be replaced by a permanent magnet. For the field detecting portion of GMR circuit 600, the GMR differential output is connected to first buffer amplifier 604 and second buffer amplifier 606 and differential amplifier 608. This makes the input impedance of the amplifier high enough to not load the GMR bridge. Resistors 612 connect the inverting terminals of first buffer amplifier 604 and second buffer amplifier 606 to decouple any common mode voltage. A series resistor/capacitor 614 in parallel with resistor 616 helps compensate for a drop in output voltage in the GMR response at a higher frequency. In an illustrative embodiment, current source 618 is a constant current source. Primarily, the constant current source offers higher noise immunity, since most radiated noise is due to induced currents caused by flux coupling. Secondarily, the voltage across a magnetically shielded GMR element stays constant in a time varying magnetic field, but increases if the temperature is increased when provided a constant current. This supports a simultaneous current and temperature measurement, which previously had not been accomplished using only one detector.

Because the GMR detector detects all fields along the axis of field sensitivity, these 'coupled' fields should be decoupled from the GMR detector output. One method for field decoupling is to use multiple sensors and a decoupling matrix. At each detector location, the total field is a sum of the fields from each of the conductors. From Ampere's law, the magnetic field in the x-direction at each of the detector locations can be derived as $AI_n = H_{nx}$.

The A matrix is the cross-coupling matrix. Each value of $H_{nx}$ is dependent on each of the currents from the conductors. The A matrix can be measured experimentally by applying a known current to one conductor at a time, and measuring the magnitude of the response at each detector location. The A matrix includes a gain between the current in conductor m and the field measured at detector location n. With this matrix, the inverse matrix can be calculated, and used to obtain the independent currents from the coupled fields as $I_n = A^{-1} H_{nx}$. In this way, the currents can be reconstructed from the measured fields. Using an experimentally derived cross-coupling matrix, n independent currents can be calculated from n properly placed field detector measurements. The cross-coupling matrix is a function of module geometry, and should be constant over some range of frequency.

There is a significant amount of unknown magnetic field noise present in any power electronics module. If point-field detectors are to be used as current sensors, the unknown disturbance fields should be decoupled from the current estimations. In Olson, E. R. and Lorenz, R. D., *Effective Use of Miniature, Multi-Point, Field-Based Current Sensors without Magnetic Cores*, Industry Applications Conference, pp. 1426-1433, Sep. 23-27, 2007, a decoupling approach is presented using n+m detectors where n is the number of currents measured and m is the order of the decoupling. Disturbance fields may compromise the accuracy of a field decoupling design unless the decoupling matrix $A^{-1}$ has extra degrees-of-freedom beyond the number of currents being measured. Extra degrees-of-freedom may be added by using more field detectors. The extra degrees-of-freedom are designated as coefficients in a polynomial function, which estimates the spatial field distribution of the unknown disturbance field. When the square cross-coupling matrix is inverted, and the currents are solved for, the polynomial coefficients are also solved for, since they are a part of the vector containing the unknown currents. Therefore, the unknown parameters representing the disturbance field are separated from the currents. This form of decoupling may be referred to as disturbance field decoupling (DFD). From the detector spacing and conductor positions, all of the values in the cross-coupling matrix are known. The inverse cross-coupling matrix can then be used to calculate currents from the measured fields, which are less sensitive to disturbance fields.

A point-field detector such as magnetic field detector 114 measures the field at a single point in space. Because of frequency related phenomenon such as eddy currents and the skin effect, the spatial distribution of the magnetic field is not a constant with varying frequency. Because the field at a point near a conductor, such as interconnect 112, is related to both frequency and current, a metric of frequency sensitivity for a given point is defined. For any conductor design, each possible location of magnetic field detector 114 has a different frequency sensitivity. The 5% flat bandwidth is defined as the frequency at which the field at a given point is ±5% of the DC field at that point. Defining this as a bandwidth is somewhat of a misnomer in that the point-field does not roll off to zero as a typical bandwidth, but tends to roll off to some asymptote, which can be above or below the DC amplitude. With superposition of multiple high frequency effects, there is also the possibility that the point-field frequency response can exceed ±5% of DC at some frequency and be within ±5% again at some higher frequency. In order to have a metric applicable to all geometries, the 5% bandwidth, also referenced as the 5% flat bandwidth (FBW) herein, is defined as the first frequency at which the given field crosses 5% of the DC field at that point.

The skin effect depends on conductor geometry as well as frequency. Since the current signals in device 100 may have a wide frequency spectrum, each frequency component has a different effective cross-section of current density throughout the conductor such as interconnect 112. Since the total current density in the conductor is both a function of position and frequency, the magnetic field surrounding the conductor has spatially varying frequency dependence over the entire spectrum as well, which causes conductor geometry to affect the 5% FBW.

The shape of the magnetic field created by current flowing through loop 124 of interconnect 112, combined with an optimal bandwidth profile, provides areas to place magnetic field detector 114. The position shown with reference to FIG. 1 is merely for illustration in terms of location and orientation. Magnetic field detector 114 is sensitive to field in one direction. With the reference frame shown in FIG. 2, the magnitude of the $H_z$ field is increased due to the shape of loop 124, whereas the $H_y$ field is small in magnitude, coming only from second straight segment 204 and fourth straight segment 212 of loop 124. The $H_x$ field is similar to that of a straight interconnect. Thus, $H_z$ is the field of interest. In other embodiments, interconnect 112 may have a differently shaped loop as discussed later.

Because of the high sensitivity of a GMR detector compared to other field sensors, it may not be necessary to place a GMR detector at the location of highest field strength. It may be acceptable to sacrifice signal strength for bandwidth performance to some degree. There are three important spatial properties when considering point-field detector positioning: the detector orientation, the 5% FBW, and the field magnitude. Thus, for a point to be a good location for magnetic field detector 114 relative to interconnect 112, the location should not only have a high 5% FBW, but also have sufficient field strength or sensed 'signal' strength. A metric that may be used to more clearly display optimal point-field detector locations may be the field weighted flat bandwidth (FWFBW), which may be defined generally as, FWFBW=$(H_{DC}/H_{DCmax})^m \cdot (FBW/FBW_{max})^n$ where FBW is the 5% FBW frequency at each XY location, $FBW_{max}$ is the maximum 5% FBW frequency, and the coefficients m and n can be selected by a designer depending on the desired attributes of the system being sensed. Thus, if it is more desirable to have field strength or a high frequency performance, the coefficients m and n can be chosen to represent that. To maintain units of bandwidth, only the DC field term may be normalized and used to weight the FBW. For example, FWFBW=$(H_{DC}/H_{DCmax})^4$. FBW may be used in an illustrative embodiment to provide a good weighting level to see both field and bandwidth properties simultaneously, without one overpowering the other. With this metric, the frequency at each XY location of the flat bandwidth plot is weighted by the normalized DC field distribution at that location. The resulting plot is still in units of frequency, but a high frequency point indicates a high FBW and comparatively high signal (field) strength at that location. It should be recognized that the field is normalized, which means that the field weighting can only reduce the flat bandwidth frequency at a given point. The result is that a point in a $FBW_{FW}$ plot showing 10 MHz indicates 10 MHz 5% FBW and maximum available field strength.

One method for reducing the placement tolerance is to use multiple magnetic field detectors. When the magnetic field detectors are spaced far apart compared to the conductor width, there are two distinct 5% FBW patterns. As the detectors are spaced closer, these patterns merge into a single pattern. As these patterns merge, the area of high 5% FBW and field strength increases.

Figure 7:
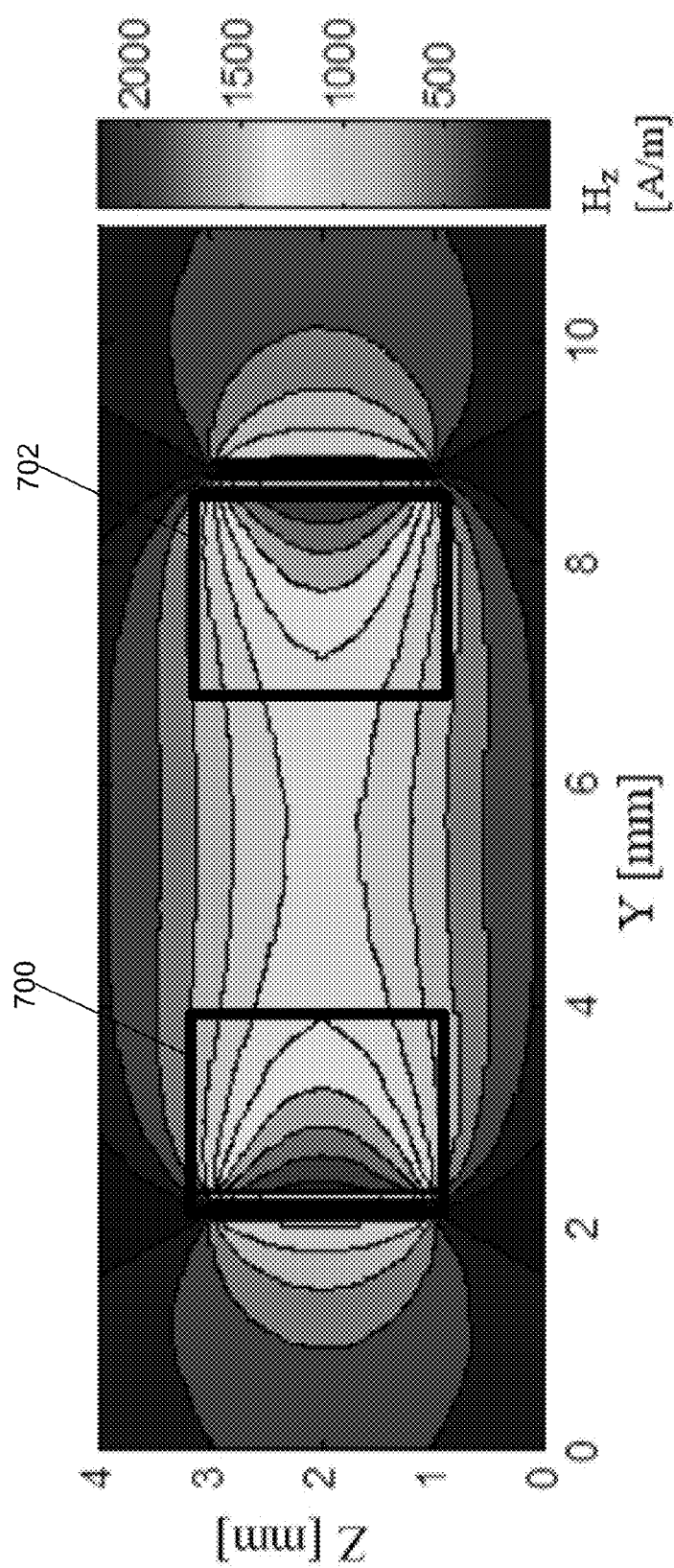
FIG. 7 depicts a YZ plane, DC $H_z$ field of the interconnect of FIG. 2 in accordance with an illustrative embodiment.

FIG. 7 shows the $H_z$ field in YZ plane 222 calculated for interconnect 112 having the illustrative shape shown in FIG. 2 and simulated using finite element analysis. The field strength is more than two times greater inside loop 124 than outside. There is a first region 700 and a second region 702, both approximately 2 mm across, where the field strength is between 1500 and 2000 amperes/meter (Nm). Additionally, the field strength at any location inside loop 124 (between ~2 mm and ~9 mm in the Y direction) at this plane is above 1000 Nm, whereas the field outside of loop 124 quickly drops below 1000 Nm.

Figure 8:
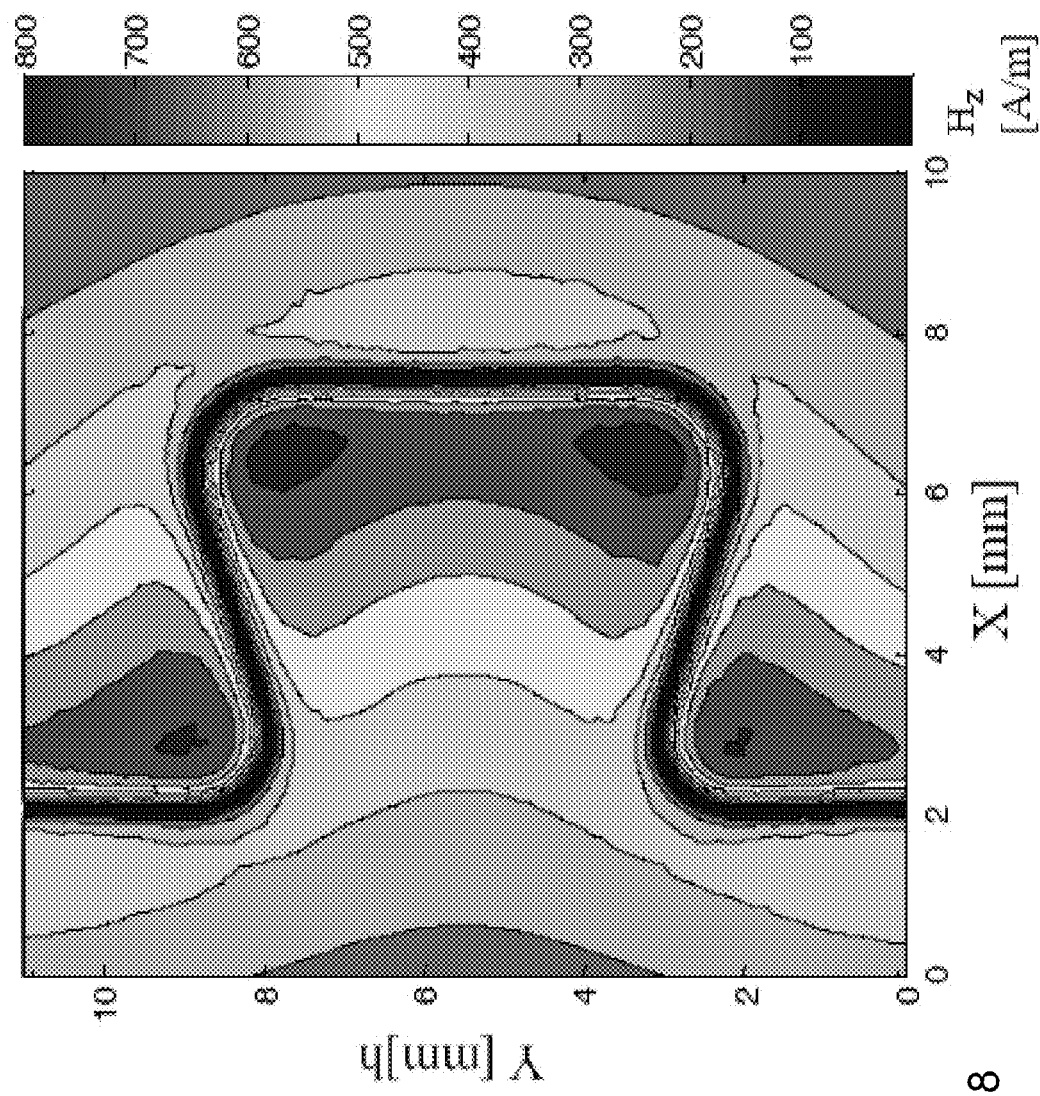
FIG. 8 depicts a XY plane, DC $H_z$ field of the interconnect of FIG. 2 in accordance with an illustrative embodiment.

FIG. 8 shows that the $H_z$ field magnitude of XY plane 224 is much lower than in YZ plane 222. The XY plane 224 intersects FIG. 7 at Z=3 mm. At this location, some of the field is in the X orientation as the field lines loop around interconnect 112. The benefit of loop 124 in field concentration is clear from FIG. 8 with significant areas of high field strength inside loop 124, and locations of maximum field at second curved segment 206 and third curved segment 210 and additional high field strength at first curved segment 202 and fourth curved segment 214.

Figure 9:
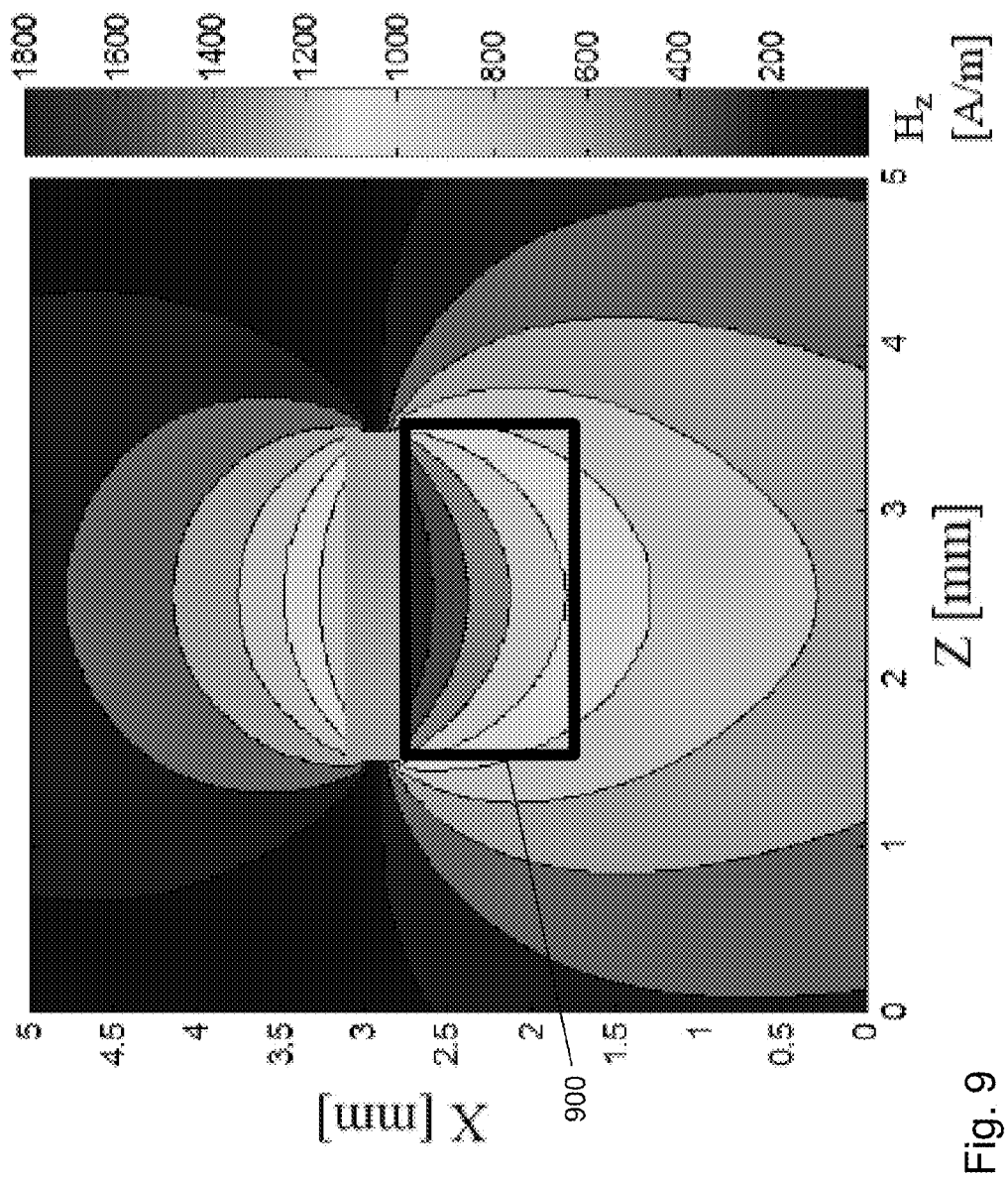
FIG. 9 depicts a XZ plane, DC $H_z$ field of the interconnect of FIG. 2 in accordance with an illustrative embodiment.

In FIG. 9, the DC $H_z$ field in XZ plane 220 calculated for interconnect 112 having the illustrative shape shown in FIG. 2 is shown. There is a region 900 where the field strength is between 1200 and 1800 A/m.

The X and Y displacement referenced in FIG. 7-9 is a displacement of magnetic field detector 114 relative to the X,Y,Z axes displayed in FIG. 2. The sensitivity of magnetic field detector 114 is in the X direction, and may be properly aligned to the field orientation displayed in FIG. 7-9.

Figure 10:
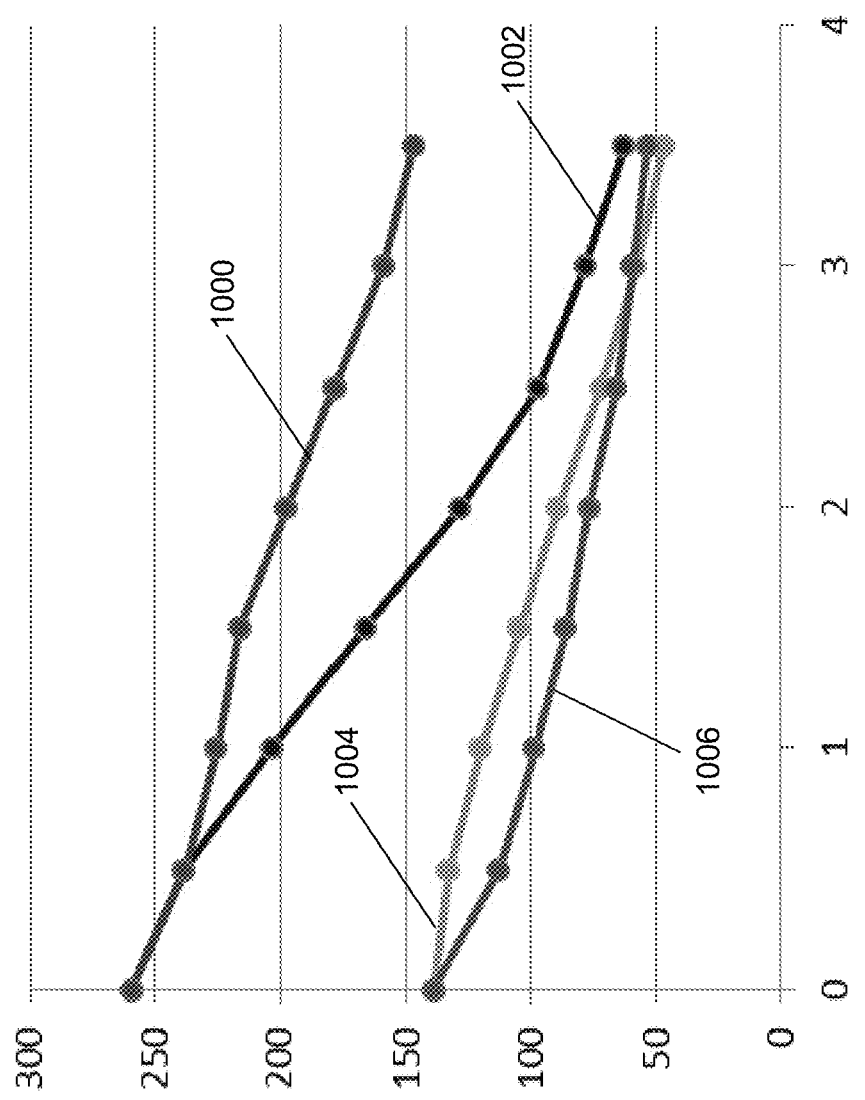
FIG. 10 depicts experimental $H_z$ field gain versus XY displacement for the interconnect of FIG. 2 in comparison to a straight interconnect in accordance with an illustrative embodiment.

FIG. 10 shows a comparison between the field strength generated by interconnect 112 having the illustrative shape shown in FIG. 2 and a straight rectangular conductor of similar cross section in accordance with an illustrative embodiment. FIG. 10 illustrates the GMR placement sensitivity for the $H_z$ field. A first curve 1000 shows the gain based on an x-displacement of magnetic field detector 114 relative to interconnect 112. A second curve 1002 shows the gain based on a y-displacement of magnetic field detector 114 relative to interconnect 112. A third curve 1004 shows the gain based on an x-displacement of magnetic field detector 114 relative to the straight rectangular conductor. A fourth curve 1006 shows the gain based on a y-displacement of magnetic field detector 114 relative to the straight rectangular conductor. The zero displacement indicates the location where magnetic field detector 114 is centered along interconnect 112, and touching interconnect 112.

As expected, the maximum field strength is significantly higher in the center of loop 124 as compared to the straight rectangular conductor. At the zero displacement position, interconnect 112 produced an 86% higher field strength than the straight rectangular conductor. The increased field strength qualitatively confirms the simulation results, but cannot be directly compared to the simulation results because the experimental results are average field, whereas the simulation results are point field. FIG. 10 shows that the X and Y placement sensitivity with respect to field strength are not equal. For interconnect 112, as magnetic field detector 114 is moved to the side out of loop (X) 124, the field strength more quickly dies off down to similar levels in comparison to the straight conductor. As magnetic field detector 114 is backed out of loop (Y) 124, the field strength maintains a significant offset from that of the straight conductor. At 3.5 mm displacement, interconnect 112 produced 177% higher field strength than the straight conductor.

Figure 11:
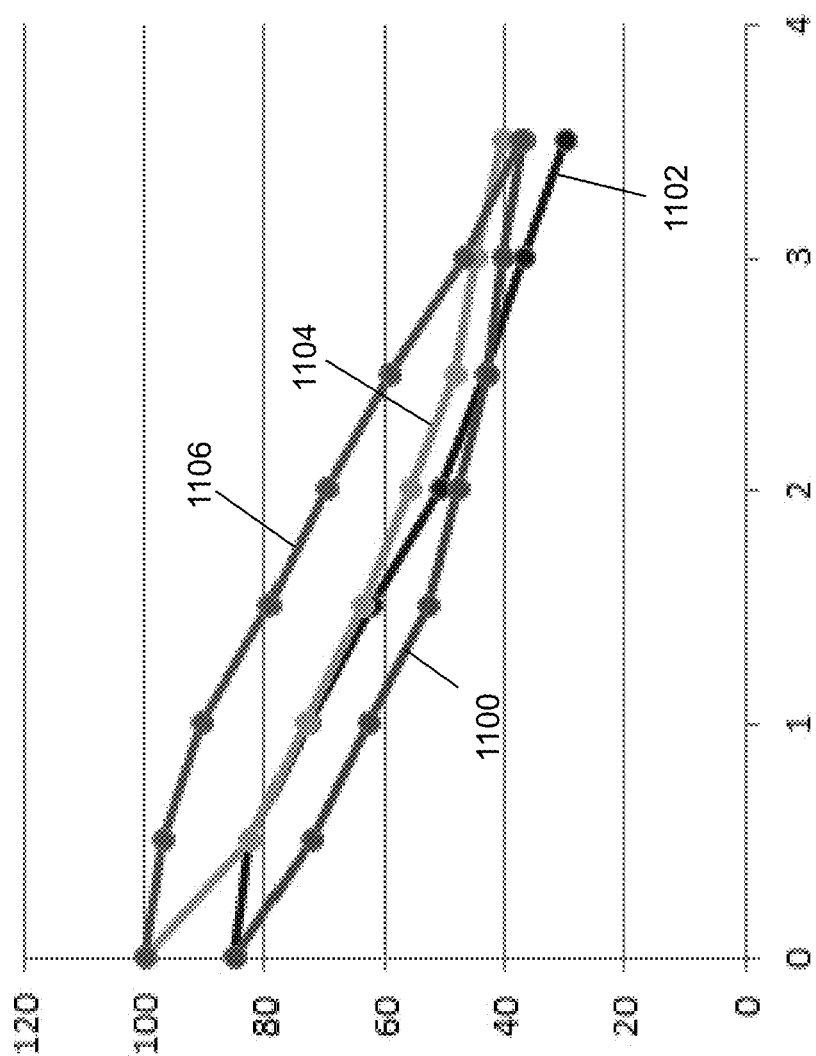
FIG. 11 depicts experimental $H_x$ field gain versus XY displacement for the interconnect of FIG. 2 in comparison to the straight interconnect in accordance with an illustrative embodiment.

The $H_x$ field is another possible orientation of interest. Magnetic field detector 114 may be aligned with a center of loop 124 in XY plane 224 and the edge of loop 124 in XZ plane 220. FIG. 11 illustrates the detector placement sensitivity for the $H_x$ field. A first curve 1100 shows the gain based on an x-displacement of magnetic field detector 114 relative to interconnect 112. A second curve 1102 shows the gain based on a y-displacement of magnetic field detector 114 relative to interconnect 112. A third curve 1104 shows the gain based on an x-displacement of magnetic field detector 114 relative to the straight rectangular conductor. A fourth curve 1106 shows the gain based on a y-displacement of magnetic field detector 114 relative to the straight rectangular conductor. FIG. 11 shows a 15% lower field strength for interconnect 112 at zero displacement compared to the straight conductor. This is due to the shape of the contact. The current in the top and bottom of loop 124 flows in the reverse direction with respect to the Y axis, canceling some of the $H_x$ field. The field strength placement sensitivity is similar between the two conductors, and between the X and Y displacement. The results of FIG. 11 indicate that this is not an optimal location for magnetic field detector 114 because it does not benefit from the loop geometry.

Figure 12A:
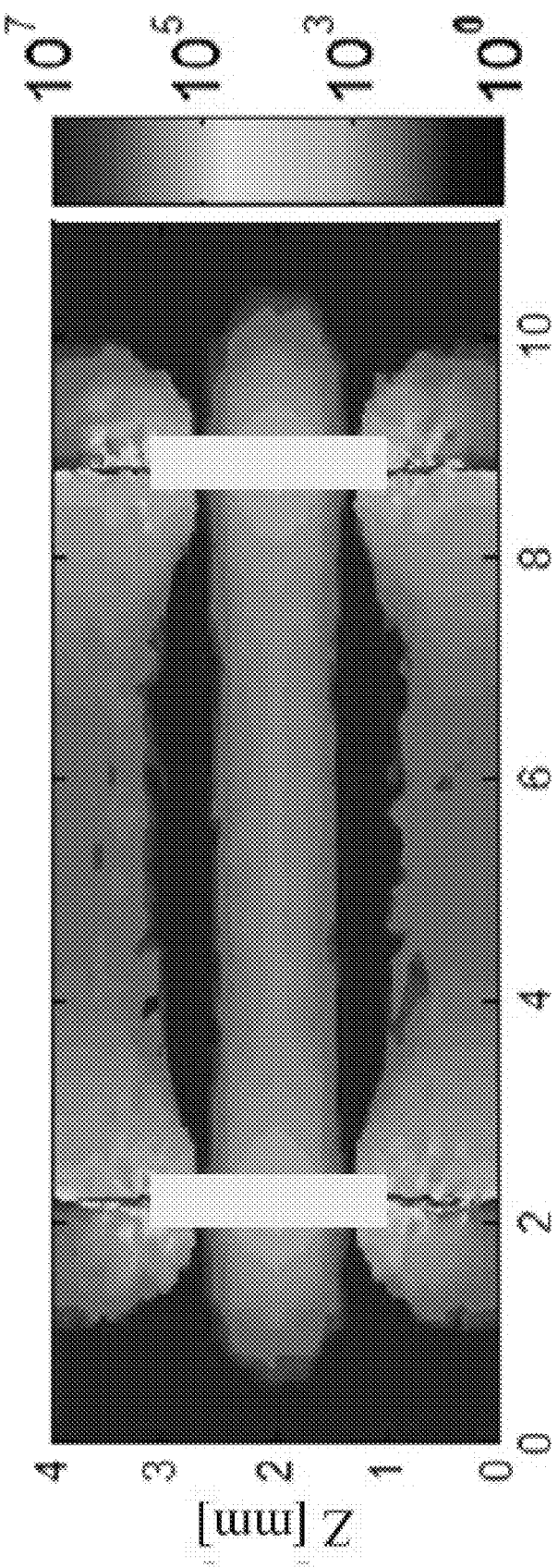
FIG. 12a depicts a YZ plane $H_z$ field 5% flat bandwidth (FBW) of the interconnect of FIG. 2 in accordance with an illustrative embodiment.
Figure 12B:
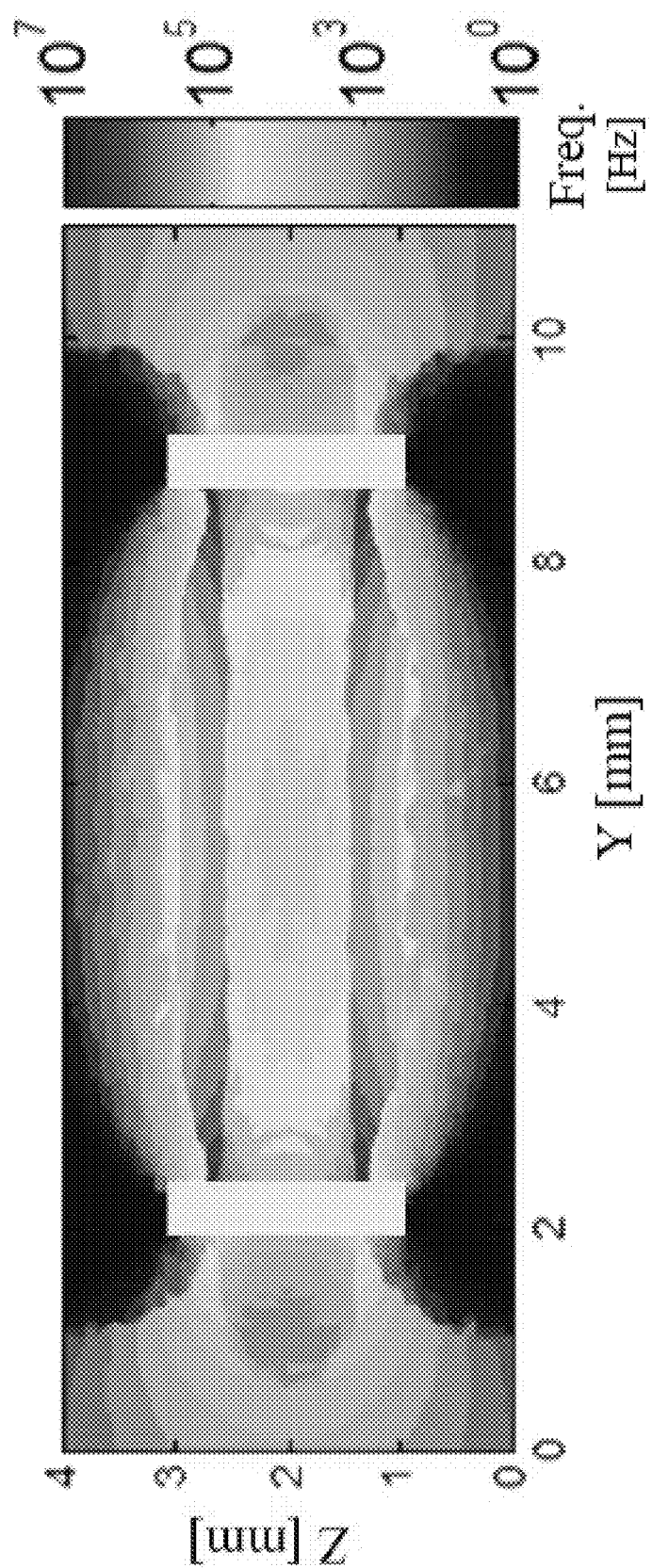
FIG. 12b depicts a YZ plane $H_z$ field weighted FBW (FWFBW) of the interconnect of FIG. 2 in accordance with an illustrative embodiment.

FIGS. 12a and 12b show simulation results calculated using finite element analysis for interconnect 112 in YZ plane 222. FIG. 12a shows the $H_z$ field 5% FBW and FIG. 12b shows the $H_z$ field FBWFW. The region of interest is in loop 124 at a plane approximately ¼ the way along the width of interconnect 112. In this plane, the region of interest is up to 0.5 mm wide.

FIGS. 13a and 13b show simulation results in XY plane 224. FIG. 13a shows the $H_z$ field 5% FBW and FIG. 13b shows the $H_z$ field FBWFW. The XY plane Z location was chosen to be within the region of interest seen in FIG. 12a. In XY plane 224, there is a fairly large region of 10 MHz 5% FBW and high field strength, located within loop 124. From FIG. 13a, it can be seen that almost the entire plane has 10 MHz FBW. FIG. 13b shows that any location within the loop also has high comparative field strength. This is an important plane for consideration because it is the plane along which magnetic field detector 114 can be easily inserted into loop 124. For the other planes, loop 124 may prevent easy insertion of magnetic field detector 114.

FIGS. 14a and 14b show simulation results in XZ plane 220. FIG. 14a shows the $H_z$ field 5% FBW and FIG. 14b shows the $H_z$ field FBWFW. With reference to FIG. 14a, regions of high flat bandwidth taper to a point approaching interconnect 112, and intersect interconnect 112 at approximately ¼ of the way along the width of interconnect 112. With reference to FIG. 14b, high field strength is maintained well beyond the tapered region of high 5% FBW.

Figures 16A, 16B:
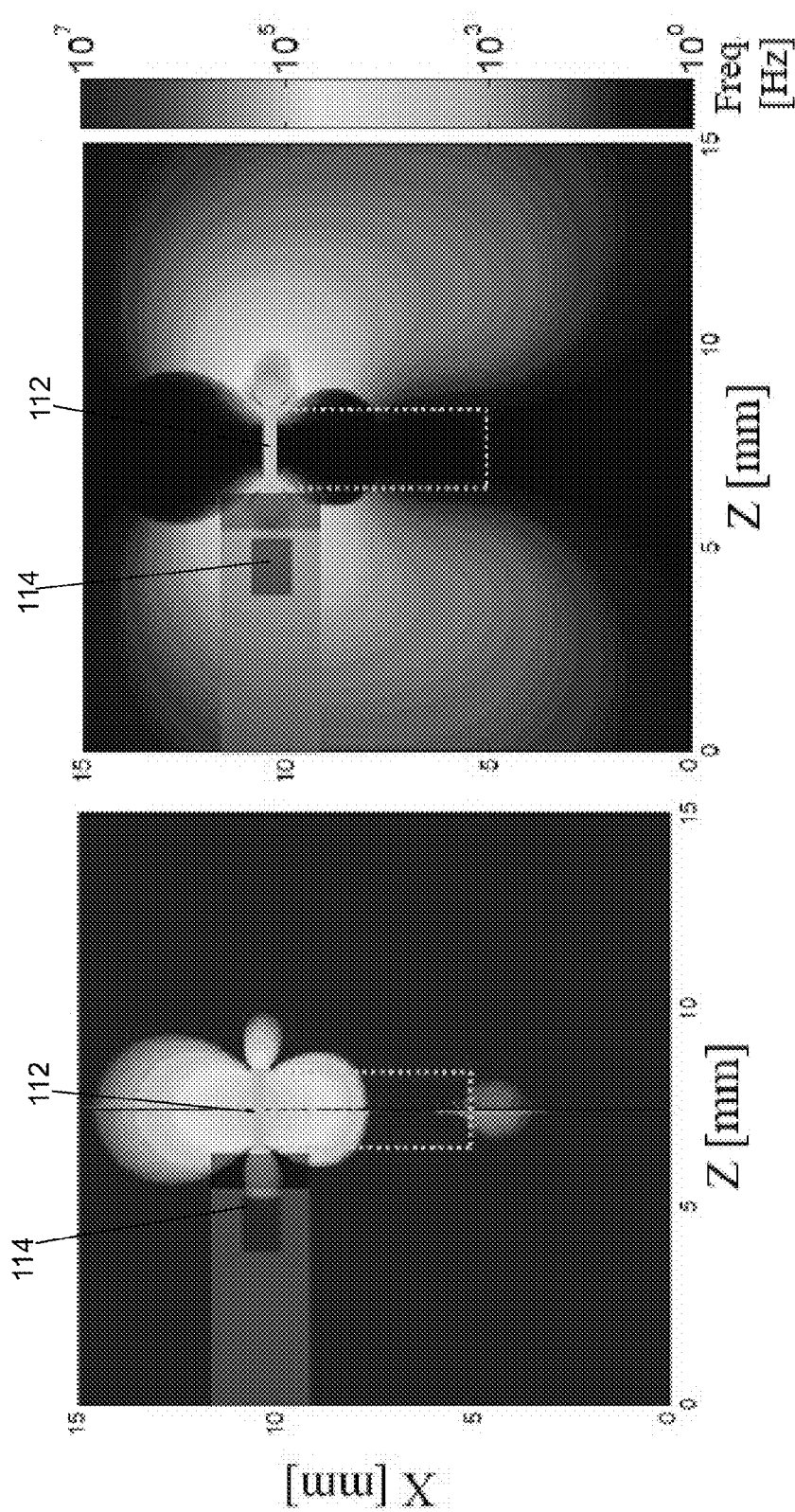
FIG. 16a depicts a XZ plane $H_z$ field 5% FBW of the interconnect of FIG. 2 with the magnetic field detector of FIG. 3 in a second orientation in accordance with an illustrative embodiment.
FIG. 16b depicts a XZ plane $H_z$ FWFBW of the interconnect of FIG. 2 with the magnetic field detector of FIG. 3 in the second orientation in accordance with an illustrative embodiment.

FIGS. 15a and 15b show magnetic field detector 114 and loop 124 overlaid on the XZ plane for a first orientation of magnetic field detector 114. FIGS. 16a and 16b show magnetic field detector 114 and loop 124 overlaid on the XZ plane for a second orientation of magnetic field detector 114. FIGS. 15a, 15b, 16a, and 16b demonstrate that the dimensions of the 5% FBW contours are small compared to the size of magnetic field detector 114. Thus, it should be possible to see some variation of 5% FBW properties at different detector locations.

Using square wave single frequency excitation tests, the $H_z$ field FBW was obtained at two locations. As expected from the finite element analysis data, magnetic field detector 114 centered on interconnect 112 showed slightly worse bandwidth performance than interconnect 112 offset by 1 mm in the X direction. At this position, interconnect 112 is moved away from the arc of low 5% FBW at the center of interconnect 112.

Current carrying conductors can only be isolated from other conducting materials in lab settings. When considering the integration of magnetic field detector 114 in device 100, all conducting material within proximity of interconnect 112 may have an impact on the field bandwidth properties, due to the eddy currents in the material induced by the alternating current fields. FIGS. 17a-17h illustrate how the 5% FBW changes as the orientation of DBC substrate 107 changes with respect to interconnect 112. With reference to FIG. 17a, DBC substrate 107 is aligned perpendicular to interconnect 112 as shown with reference to FIG. 1. As shown with reference to FIG. 17b, which shows the 5% FBW, there is negligible difference between this case and the case in which no DBC substrate 107 is present. This is due to the fact that the majority of the flux around interconnect 112, created by the current, is not passing through DBC substrate 107, and is therefore not inducing eddy currents in DBC substrate 107.

With reference to FIG. 17c, DBC substrate 107 is aligned parallel with interconnect 112. FIG. 17d shows the corresponding 5% FBW. With reference to FIG. 17e, DBC substrate 107 is aligned parallel with interconnect 112 with DBC substrate 107 facing the closed side of loop 124. FIG. 17f shows the corresponding 5% FBW. With reference to FIG. 17g, DBC substrate 107 is aligned parallel with interconnect 112 with DBC substrate 107 facing the open side of loop 124. FIG. 17h shows the corresponding 5% FBW. The results show a fairly low sensitivity to the orientation of DBC substrate 107 relative to interconnect 112.

The equation for the magnetic field at a point centered along a straight section of wire is $B=\mu_0 I/2\pi R$. Of course, $B=\mu H$ to explicitly relate the magnetic flux density B to the magnetic field H. At a given point inside of loop 124, the largest component of the $H_z$ field is due to the section of loop 124 the point is closest to. The $H_z$ field also has significant components from the other portions of loop 124. FIGS. 15a, 15b, 16a, and 16b showed that only FBW in the region in close proximity to the cross section of interconnect 112 were affected by the skin effect in interconnect 112. The three dimensional shape of interconnect 112 does not change the skin effect in the interconnect 112, but does vary the proportion of the $H_z$ field at a given location that is affected by eddy currents in a conducting sheet such as DBC substrate 107.

A number of parametric variations of the design of interconnect 112 were simulated to determine their effect on the 5% FBW and field shaping and concentration properties. These simulations enable the development of some preliminary interconnect design rules for magnetic field detector 114 based current sensor integration. With reference to FIGS. 18a-18b, four modifications to the shape of interconnect 112 are shown. With reference to FIG. 18a, a second interconnect 112a is shown. Second interconnect 112a is similar to interconnect 112 except that second interconnect 112a includes a second loop 124a. Second loop 124a is similar to loop 124 except that a gap 1800 between first curved segment 202 and fourth curved segment 214 is reduced by reducing first transition angle 230, second transition angle 232, third transition angle 234, and fourth transition angle 236. The goal of this modification was to increase the field at the center of second loop 124a.

With reference to FIG. 18b, a third interconnect 112b is shown. Third interconnect 112b is similar to interconnect 112 except that third interconnect 112b includes a third loop 124b that is continuously curved, and thus, does not include any straight segments. With reference to FIG. 18c, a fourth interconnect 112c that includes a fourth loop 124c is shown. Fourth interconnect 112c is similar to third interconnect 112b except that fourth loop 124c has a smaller radius. The goal of these modifications was to obtain a more uniform field distribution in the center of third loop 124b and fourth loop 124c.

Figure 18D:
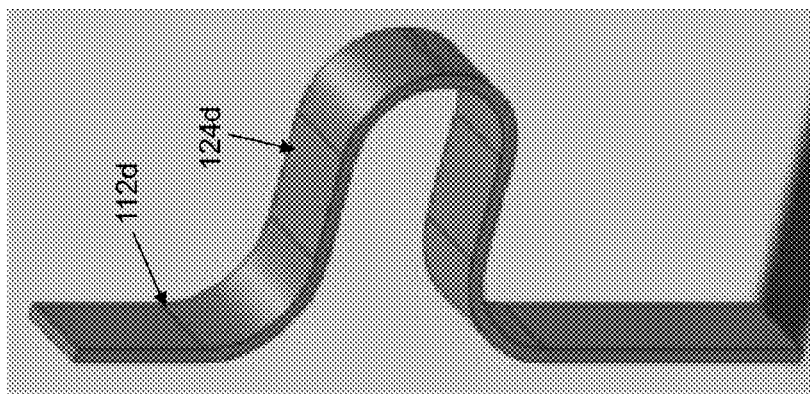
FIGS. 18a-18d depict four modifications to the interconnect of FIG. 2 in accordance with illustrative embodiments.
Figure 18C:
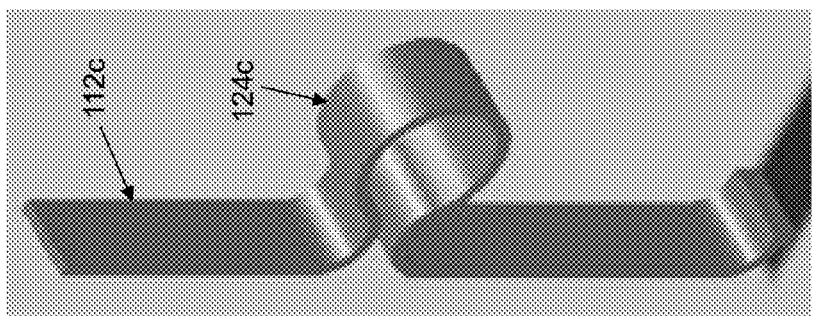
Figure 18B:
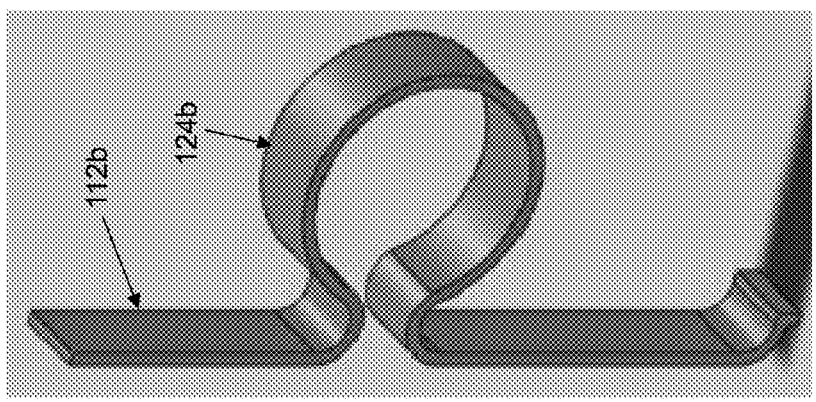
Figure 18A:
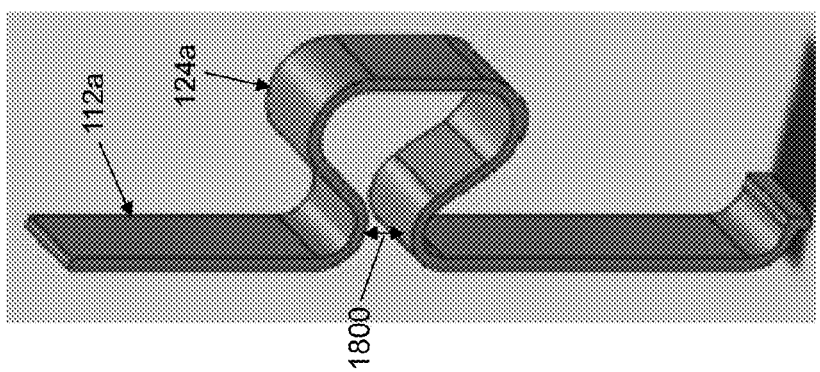

With reference to FIG. 18d, a fifth interconnect 112d is shown. Fifth interconnect 112a includes a fifth loop 124d. Fifth loop 124d is similar to loop 124 except that third straight segment 208 has been removed and first transition angle 230, second transition angle 232, third transition angle 234, and fourth transition angle 236 have been increased.

Figure 19:
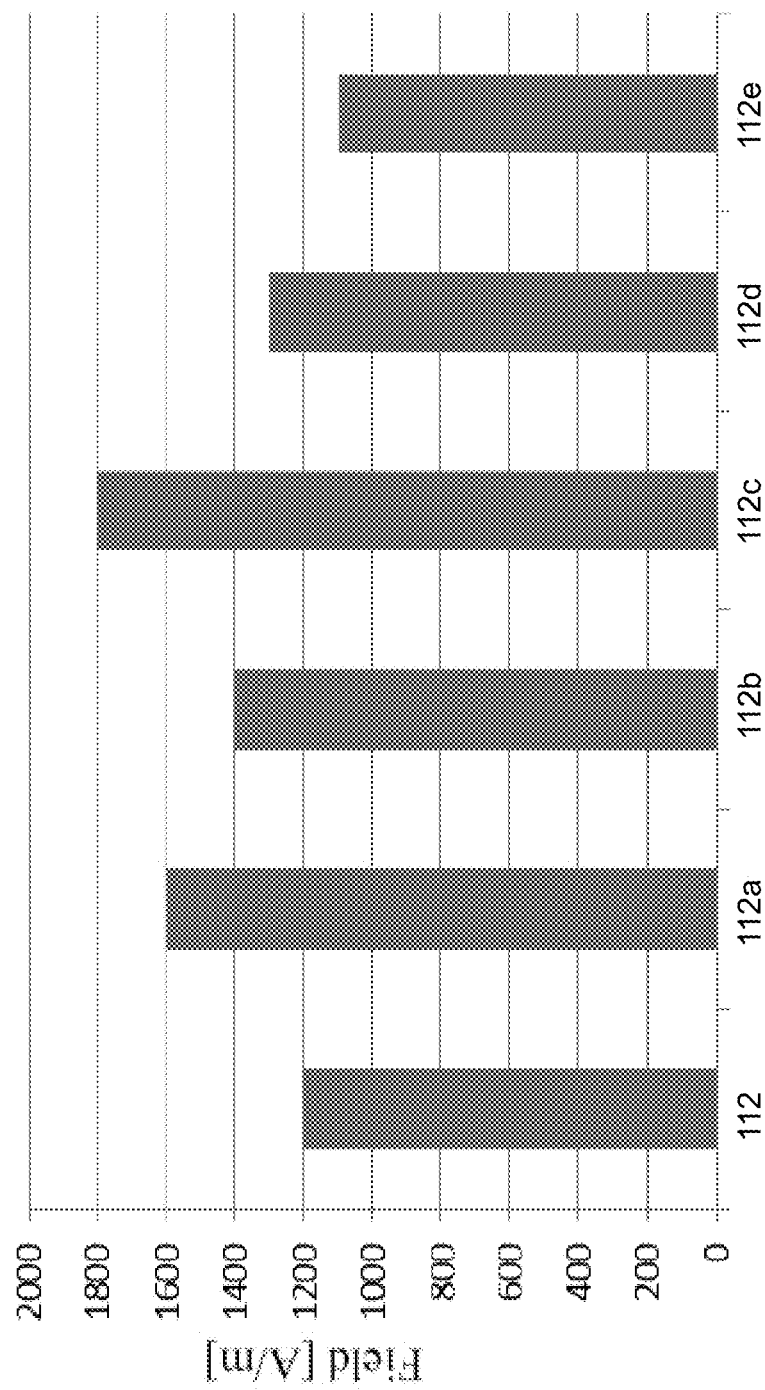
FIG. 19 depicts a bar chart that indicates a DC $H_z$ field at a center of a loop of the illustrative interconnects of FIGS. 2 and 18a-18d.
Figure 20B:
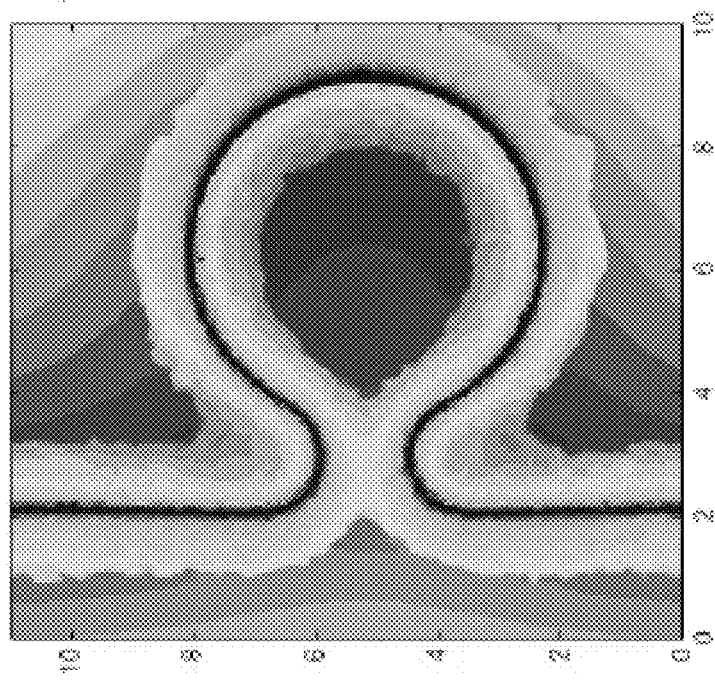
FIGS. 20a-20e depict a XY plane $H_z$ field 5% FBW of the interconnects of FIGS. 2 and 18a-18d.
Figure 20A:
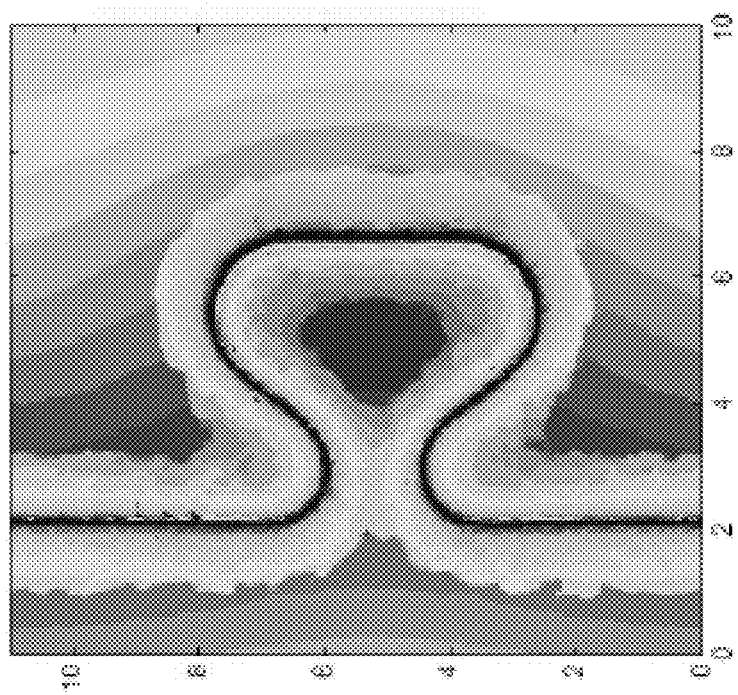
Figure 20D:
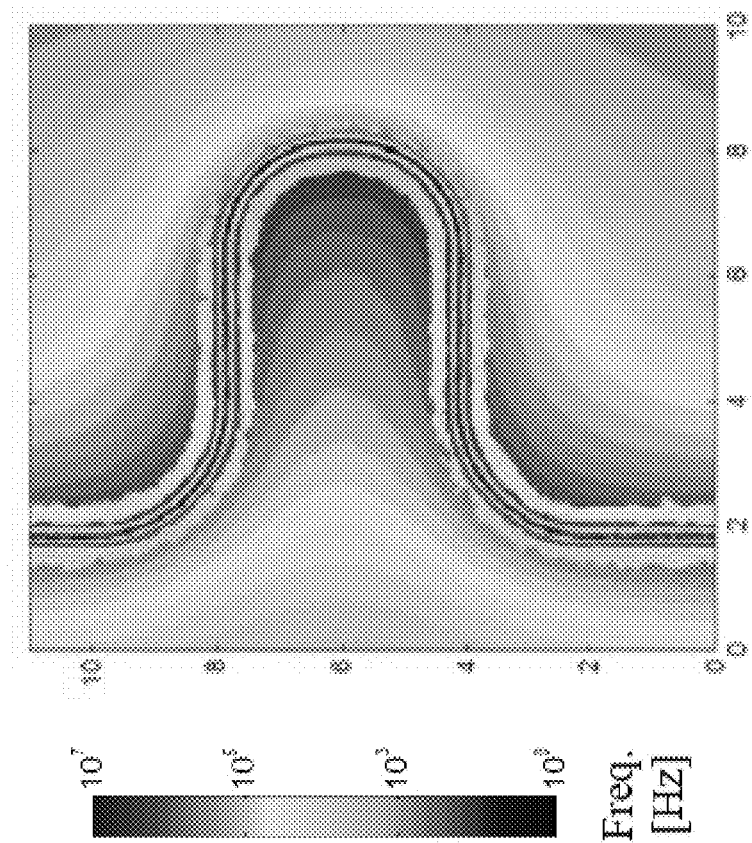
Figure 20C:
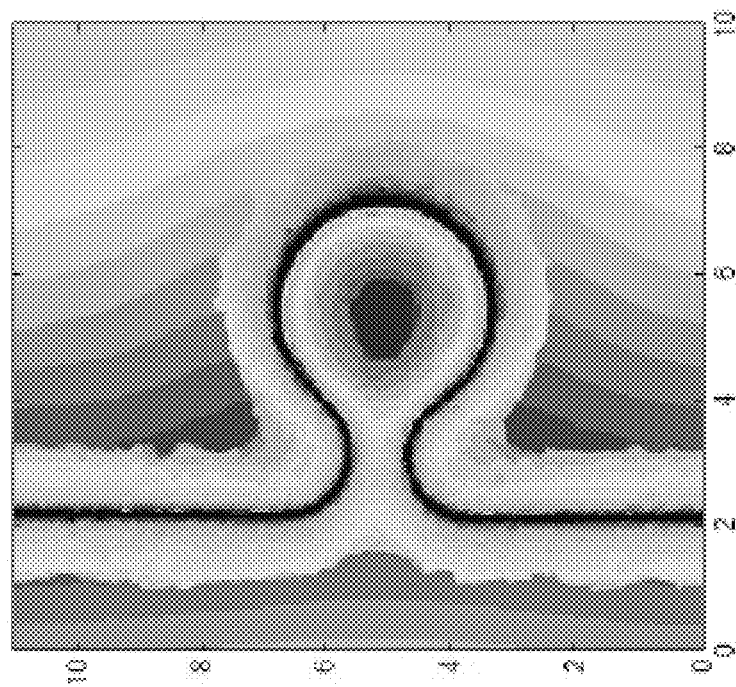
Figure 20E:
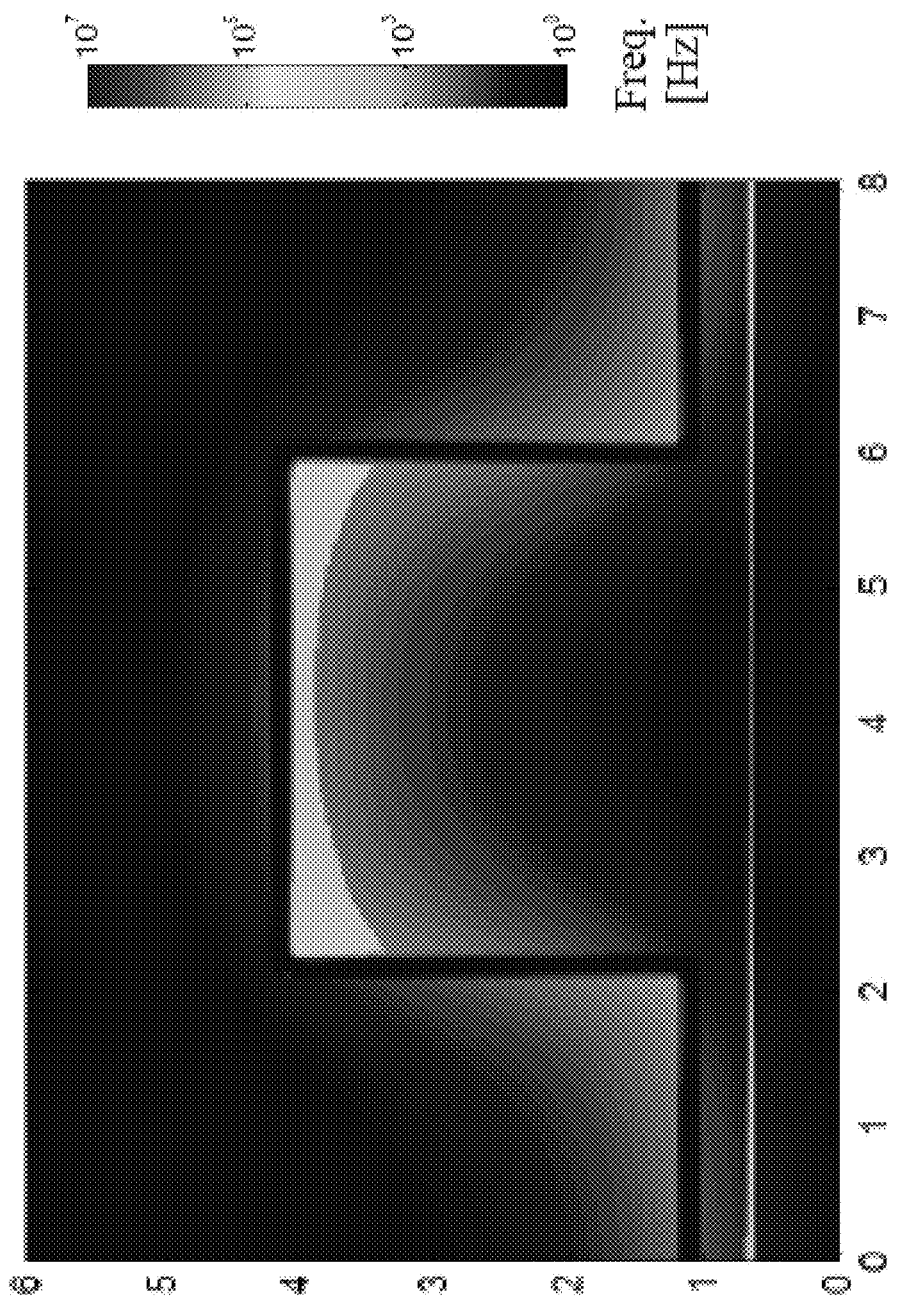

FIG. 19 shows the magnitude of the $H_z$ field at the center of each of loop 124, second loop 124a, third loop 124b, fourth loop 124c, fifth loop 124d for each of interconnect 112, second interconnect 112a, third interconnect 112b, fourth interconnect 112c, fifth interconnect 112d, respectively. A sixth interconnect 112e was also simulated including a sixth loop 124e having the shape of a lead frame as understood by a person of skill in the art. Second loop 124a resulted in a higher field strength than loop 124. Fourth loop 124c resulted in a higher field strength than the larger radius third loop 124b. The circular loops of third loop 124b and of fourth loop 124c resulted in a higher and more uniform field than loop 124. Sixth interconnect 112e which has squared corners resulted in the lowest field strength.

FIGS. 20a-20e provide the finite element analysis results for the 5% FBW. Second loop 124a, third loop 124b, and fourth loop 124c produce significant areas of high field concentration and high FBW. Fifth loop 124d has high FBW, but the open loop design results in lower field concentration at the center of fifth loop 124d than the other modifications. Sixth interconnect 112e had a high field concentration at the corners, and low 5% FBW over the entire area due to the orientation of DBC substrate 107. For all modifications shown, DBC substrate 107 was simulated in its normal orientation, which in each figure is along the bottom axis.

Figure 21:
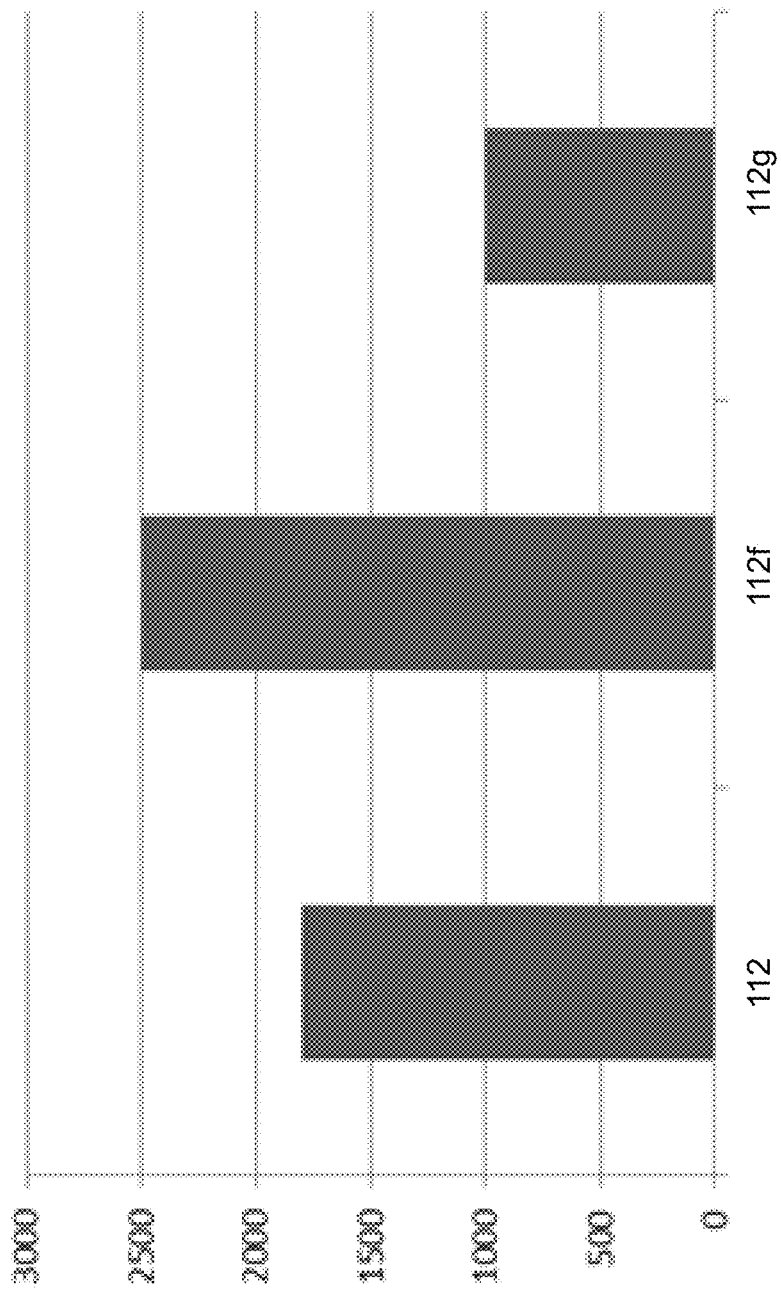
FIG. 21 depicts a bar chart that indicates a DC $H_z$ field at a center of a loop of three interconnects having varying cross sectional shapes in accordance with illustrative embodiments.

With reference to FIG. 21, the cross sectional shape of the segments of interconnect 112 were modified. Though the cross sectional area remained constant the proportions were varied, and the impact on the field shaping and concentration was compared. A sixth interconnect 112f is twice as thick and half as wide as interconnect 112. A seventh interconnect 112g is half as thick and twice as wide as interconnect 112. DBC substrate 107 is oriented parallel to interconnect 112, sixth interconnect 112f, and seventh interconnect 112g to observe the field shaping and concentration.

The results of FIG. 21 demonstrate that the cross sectional dimensions have a strong influence on the 5% FBW with DBC substrate 107 or another a conducting sheet in close proximity. As the cross section becomes more rectangular, the field shaping and concentration is reduced. Interconnect 112 produced a much smaller area of high 5% FBW than the more square sixth interconnect 112f. The proportions of the cross sectional area also strongly affects the maximum field strength.

The maximum DC field increases by around 40% when the thickness is doubled and the area remains constant. The maximum DC field decreases by around 40% when the width is doubled and the area remains constant. With respect to both the field strength and 5% FBW performance, the design rule is that a square cross sectional area produces the highest field strength and largest area of high 5% FBW performance.

It is logical to assume that the radius of loop 124 has a strong effect on the 5% FBW field shaping and concentration of interconnect 112. From the field equation for a single loop of wire, the field strength in the center of the loop is inversely proportional to the radius of the loop. If field strength is the only metric of interest, the loop should be designed with the minimum possible radius to increase the signal to noise ratio. Considering a location near one side of the loop, as the radius of the loop is increased, the proportion of the total field due to the remainder of the loop is reduced. This reduces the total field strength as well as the field shaping and concentration as discussed previously. This means that with respect to field shaping and concentration, the loop radius should also be as small as possible.

Figure 22C:
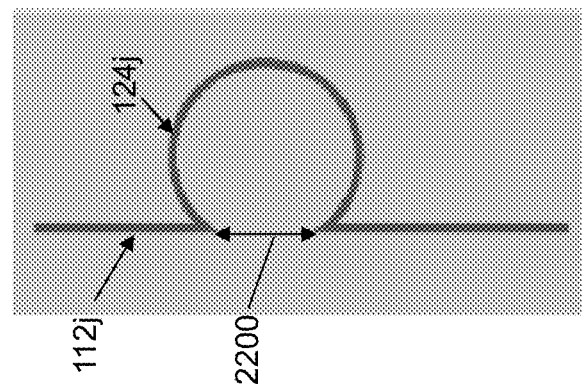
FIGS. 22a-22c depict three additional modifications to the interconnect of FIG. 2 in accordance with illustrative embodiments.
Figure 22B:
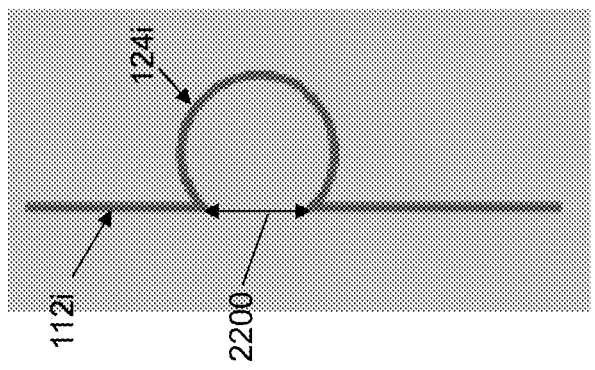
Figure 22A:
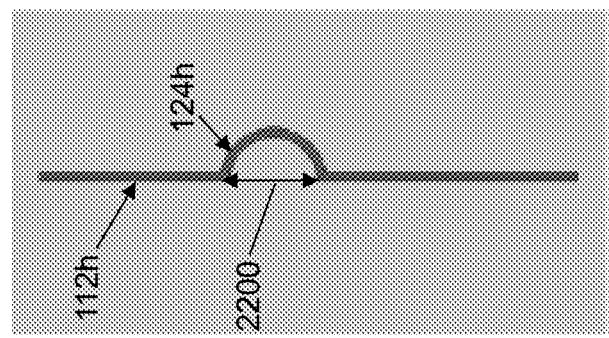

With reference to FIGS. 22a-22c, three additional modifications to the shape of interconnect 112 are shown. With reference to FIG. 22a, an eighth interconnect 112h is shown that includes a semi-circle shaped eighth loop 124h having a gap 2200. With reference to FIG. 22b, a ninth interconnect 112i is shown that includes a circular shaped ninth loop 124i that has the same sized gap as gap 2200 of eighth interconnect 112h, but a 2.5 mm radius in comparison to a 1.5 mm radius for eighth loop 124h. With reference to FIG. 22c, a tenth interconnect 112j is shown that includes a circular shaped tenth loop 124j that has the same sized gap as gap 2200 of eighth interconnect 112h, but a 3.0 mm radius.

Figure 23A:
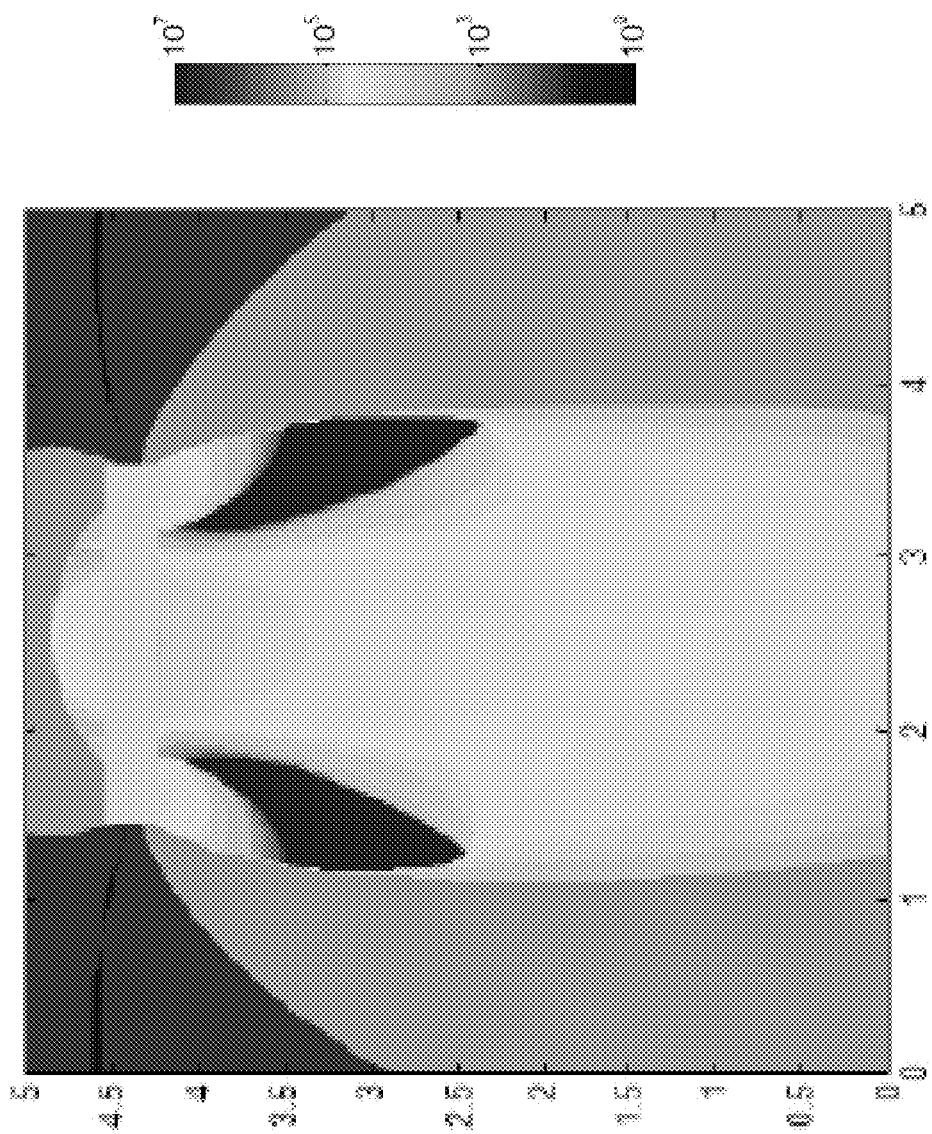
FIGS. 23a-23c depict a XY plane $H_z$ field 5% FBW of the interconnects of FIGS. 22a-22c.
Figure 23B:
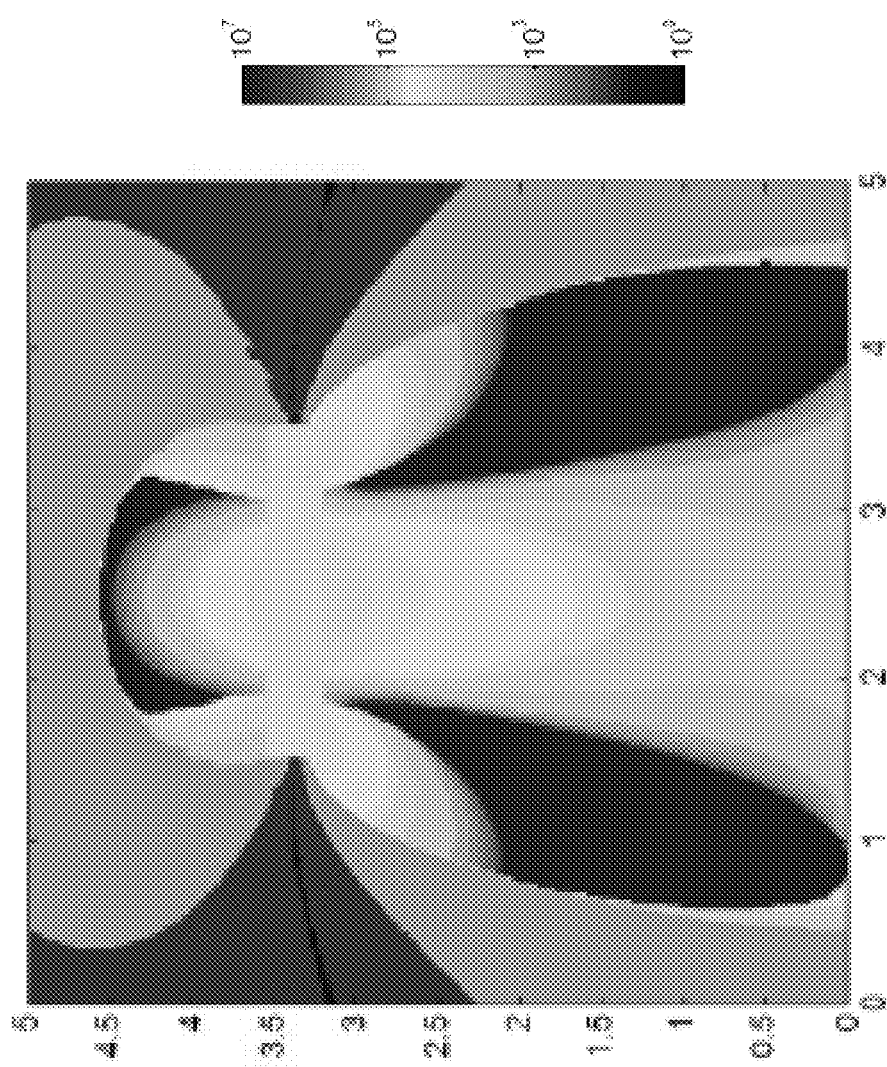
Figure 23C:
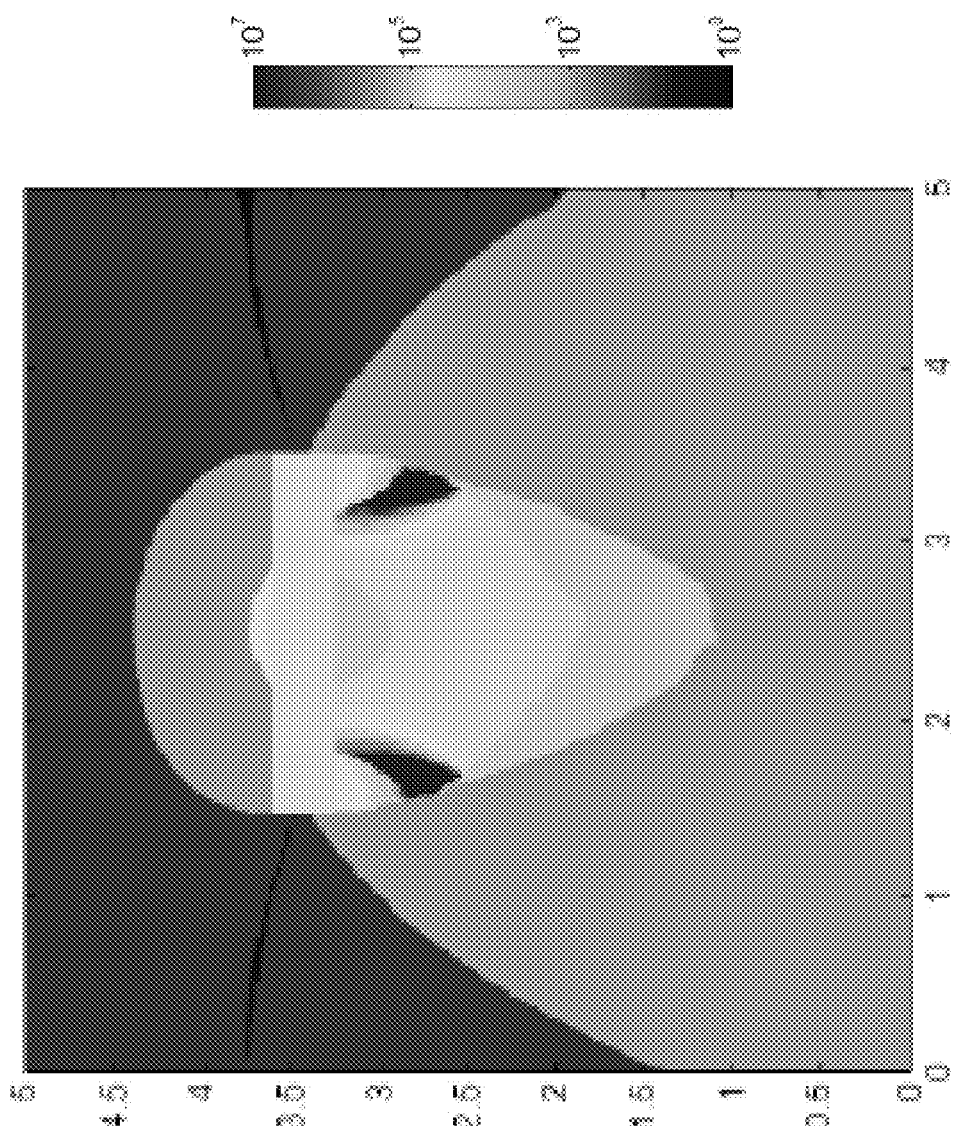
Figure 25A:
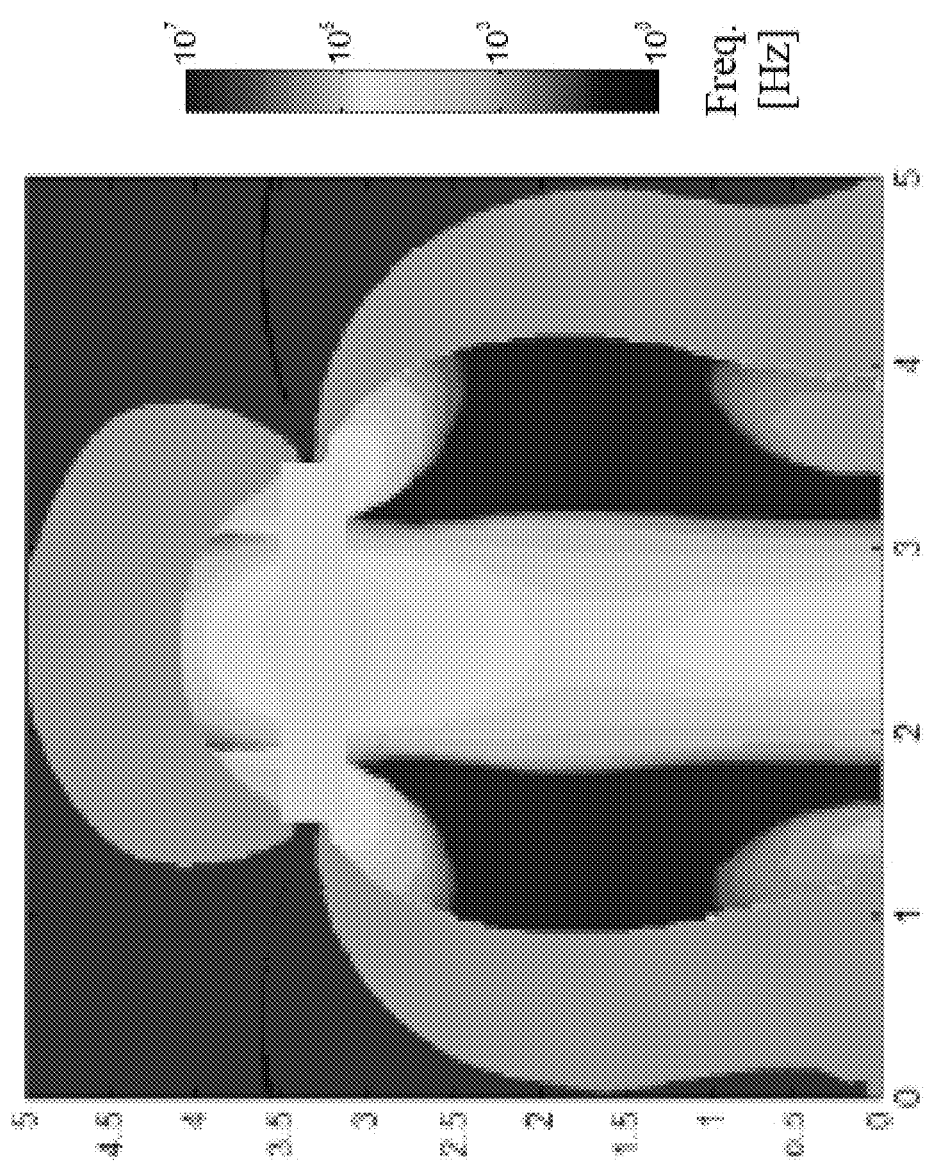
FIGS. 25a-25e depict a XY plane H, field 5% FBW of the interconnects of FIGS. 24a-24e.
Figure 25B:
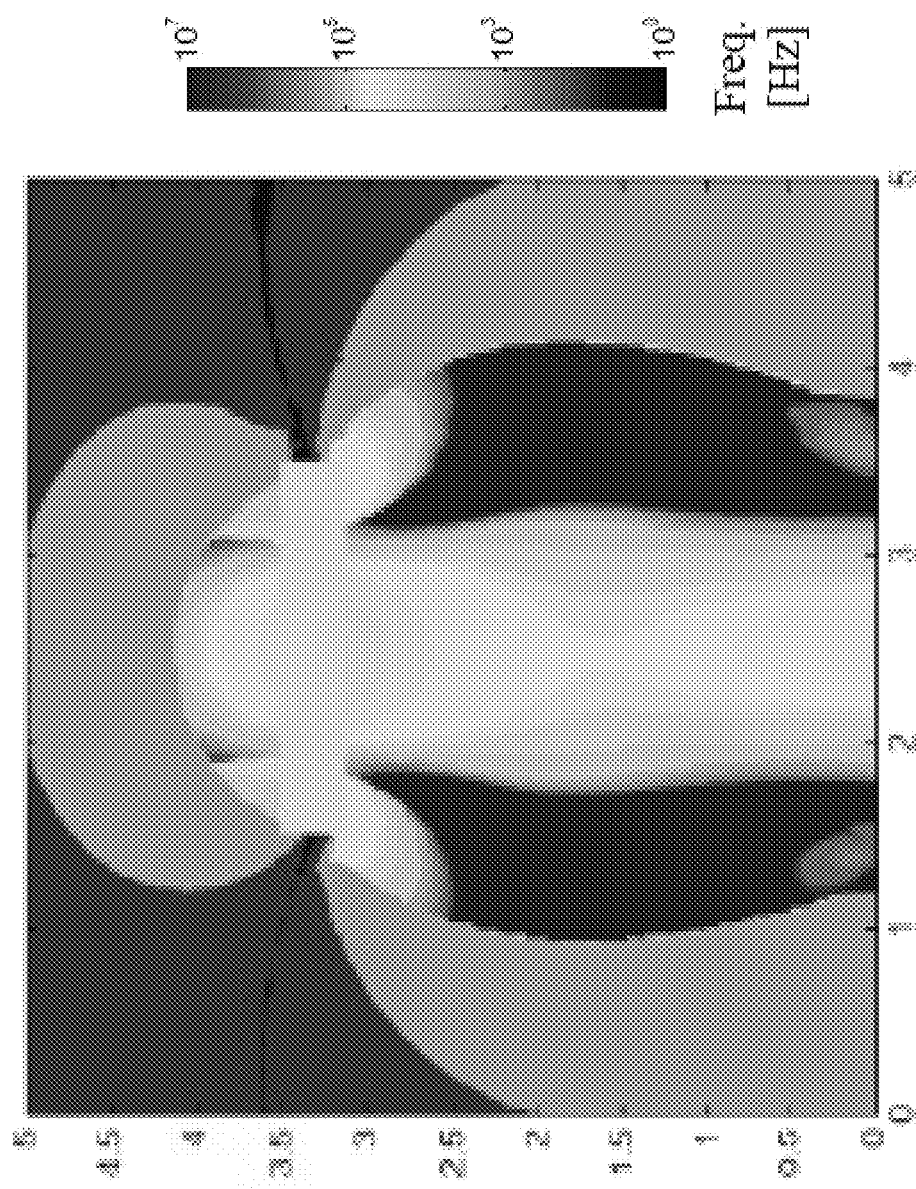
Figure 25C:
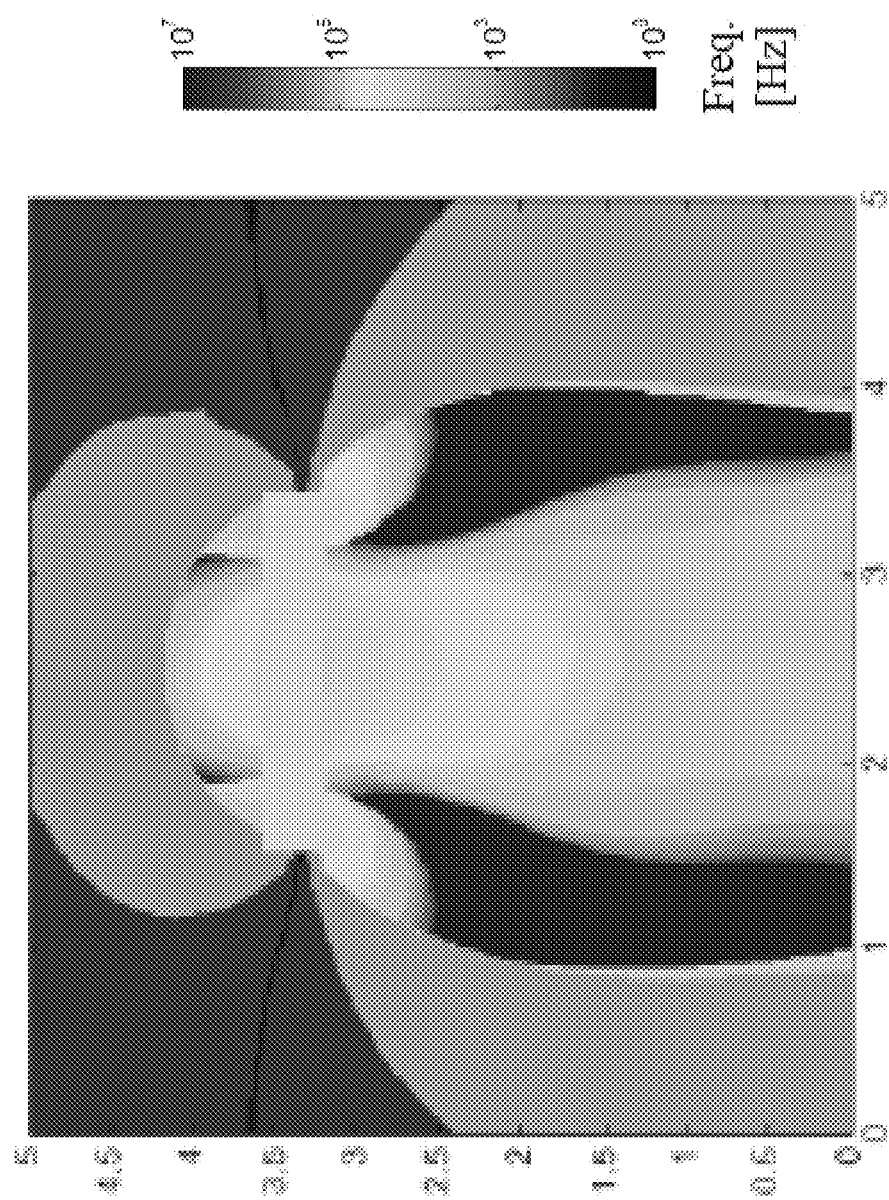
Figure 25D:
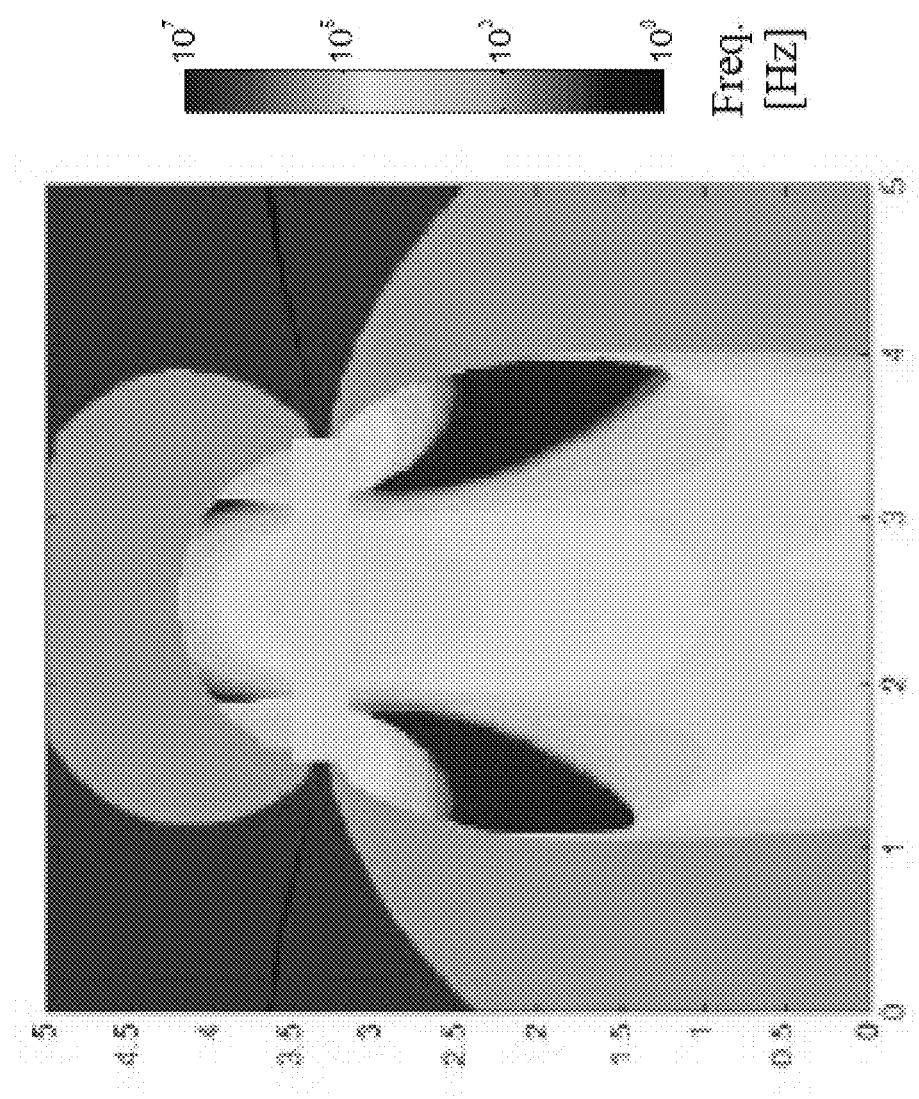
Figure 25E:
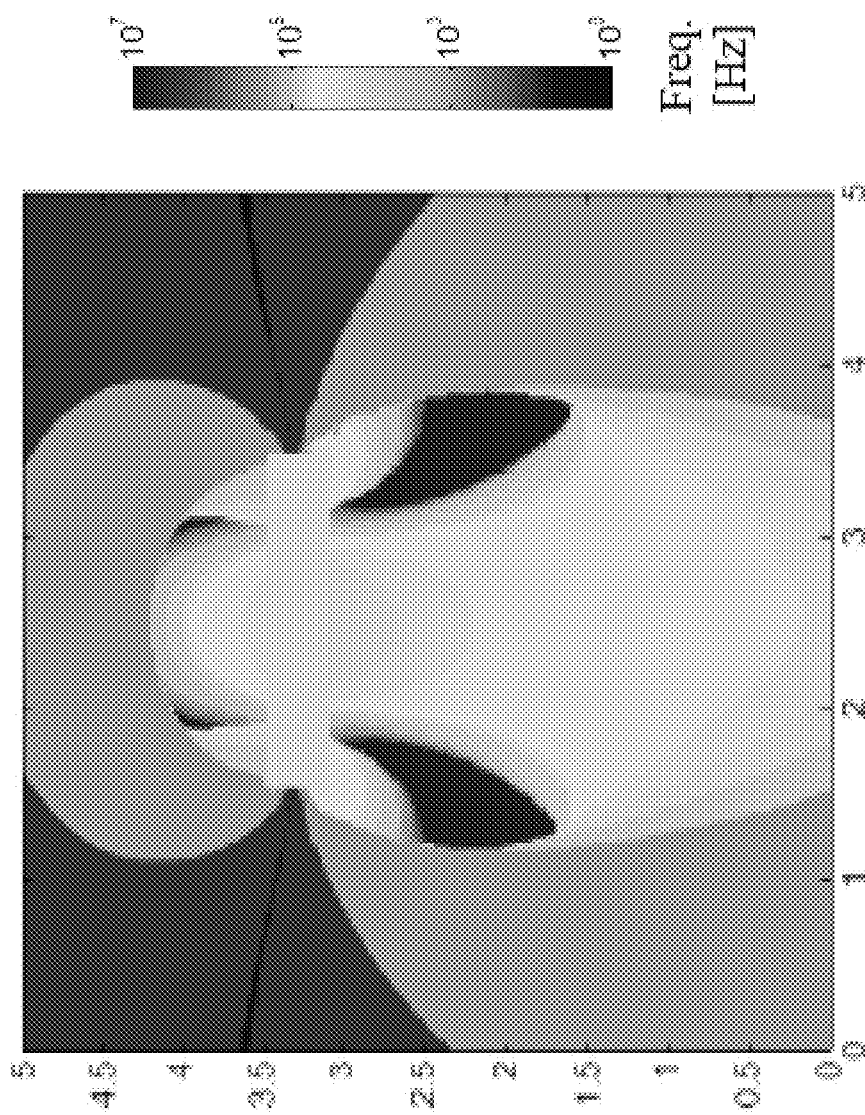

FIGS. 23a-23c provide the finite element analysis results for the 5% FBW of eighth interconnect 112h, ninth interconnect 112i, and tenth interconnect 112j, respectively. DBC substrate 107 was simulated in its normal orientation, which in each figure is along the bottom axis. As expected from the theoretical discussion, a smaller loop radius results in less impact on the 5% FBW from DBC substrate 107.

The size of the gap in interconnect 112 formed by loop 124, or any of the other described modifications, can be varied to affect the field shape. A smaller gap should increase the proportion of the field near the right side of loop 124 that is due to the top and bottom of loop 124. This should increase the effective field shaping and concentration of the loop. With reference to FIGS. 24a-24e, five additional modifications to the shape of interconnect 112 are shown. With reference to FIG. 24a, an eleventh interconnect 112k is shown that includes a triangle shaped eleventh loop 124k having a first gap 2400. First gap 2400 was approximately 0 mm. With reference to FIG. 24b, a twelfth interconnect 112l is shown that includes a triangle shaped twelfth loop 124l having a second gap 2402. Second gap 2402 was approximately 1 mm. With reference to FIG. 24c, a thirteenth interconnect 112m is shown that includes a triangle shaped thirteenth loop 124m having a third gap 2404. Third gap 2404 was approximately 2 mm. With reference to FIG. 24d, a fourteenth interconnect 112n is shown that includes a triangle shaped fourteenth loop 124n having a fourth gap 2406. Fourth gap 2406 was approximately 3 mm. With reference to FIG. 24e, a fifteenth interconnect 112o is shown that includes a triangle shaped fifteenth loop 124o having a fifth gap 2408. Fifth gap 2408 was approximately 4 mm.

FIGS. 25a-25e provide the finite element analysis results for the 5% FBW of eleventh interconnect 112k, twelfth interconnect 112l, thirteenth interconnect 112m, fourteenth interconnect 112n, and fifteenth interconnect 112o, respectively. Over some range of gap for a given loop there appears to be little effect when increasing the size of the gap. In this example, there is a very significant change in 5% FBW between 2 and 3 mm. These results do not contradict the proposed design rule of as small a gap as possible, but do show that over some range the gap does not have a strong effect.

When designing interconnects, the electrical parasitic properties of the interconnect should be considered. The DC parasitic resistances of the various interconnect designs are the same and are approximately twice that of a straight rectangular interconnect spanning the same distance. As expected from an understanding of the skin effect, seventh interconnect 112g has 23% lower resistance at 10 MHz than interconnect 112. Sixth interconnect 112f has 23% higher resistance at 10 MHZ than interconnect 112. With respect to field strength and field shaping and concentration, sixth interconnect 112f has the highest performance and seventh interconnect 112g has the lowest. With respect to parasitic resistance, the opposite is true. For all cases, the skin effect begins to notably increase the resistance after 100 kHz.

For many applications, the parasitic inductance of the interconnect is of more importance than the resistance due to its affect on switching loss. The parasitic inductance is also significantly affected by the cross sectional dimensions. In the same order as the high frequency resistance, sixth interconnect 112f has the highest inductance followed by interconnect 112 and seventh interconnect 112g. A straight interconnect without a loop has the lowest parasitic inductance. Interconnect 112 has an approximately 40% higher parasitic inductance than the straight interconnect. All cross sectional dimensions show little variation in inductance over the frequency range.

The parasitic resistance had no notable variation between second interconnect 112a, third interconnect 112b, fourth interconnect 112c, and fifth interconnect 112d except for third interconnect 112b, which has a DC offset due to the increased DC resistance from the increased length of the large loop. The same is true of the parasitic inductance, where third interconnect 112b has a DC offset in initial inductance due to the reduced proportion of the gap relative to the loop circumference.

There are multiple properties that should be considered when designing interconnect 112 and locating magnetic field detector 114 relative to interconnect 112 to provide current sensing. Optimal properties for locating magnetic field detector 114 relative to interconnect 112 to provide current sensing were defined as having significant areas of high 5% FBW with corresponding high field strength that are not strongly degraded in the presence of conducting material such as DBC substrate 107. Of the design variations evaluated, the best properties were achieved with a square cross-section, minimum loop radius, and minimum gap length. Optimal electrical properties were defined as having low parasitic resistance and inductance. Of the design variations, the best electrical properties were achieved with a rectangular cross-section, maximum radius, and maximum gap length. Thus, there is a tradeoff between field and electrical properties. When integrating magnetic field detector 114 to provide current sensing, the field properties may be more important, outweighing the increase in parasitics.

As used in this disclosure, the term "mount" includes join, unite, connect, associate, insert, hang, hold, affix, attach, fasten, bind, paste, secure, bolt, screw, rivet, solder, weld, glue, form over, layer, etch, and other like terms. The phrases "mounted on" and "mounted to" include any interior or exterior portion of the element referenced. As used herein, the mounting may be a direct mounting between the referenced components or an indirect mounting through intermediate components between the referenced components.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A device comprising:
a first electrical connector;
a second electrical connector;
an interconnect mounted in electrical contact with the first electrical connector and the second electrical connector, the interconnect including a loop, wherein the loop includes a curved segment; and
a magnetic field detector located in an interior of the loop adjacent to the curved segment of the loop of the interconnect, wherein the magnetic field detector is located to detect a current flowing in the interconnect when the current flows in the interconnect.

2. The device of claim 1, wherein the magnetic field detector is located to detect the current flowing in the interconnect when the current flows in the interconnect based on a value of a 5% flat bandwidth and a value of a magnetic field strength of a magnetic field generated when the current flows in the interconnect.

3. The device of claim 1, wherein the loop further includes a plurality of curved segments that are each mounted between two straight segments, wherein the curved segment is one of the plurality of curved segments.

4. The device of claim 1, wherein the interconnect further includes a first straight segment, a first curved segment including a first end and a second end, a second straight segment, a second curved segment including a first end and a second end, wherein the first end of the first curved segment is mounted to the first straight segment and the second end of the first curved segment is mounted to a first end of the loop, wherein the first end of the second curved segment is mounted to the second straight segment and the second end of the second curved segment is mounted to a second end of the loop.

5. The device of claim 4, wherein the curved segment extends from the first end of the loop to the second end of the loop.

6. The device of claim 4, wherein the loop further includes a third straight segment and a fourth straight segment mounted on either side of the curved segment, wherein the third straight segment is further mounted to the second end of the first curved segment and the fourth straight segment is further mounted to the second end of the second curved segment.

7. A device comprising:
a first electrical connector;
a second electrical connector;
an interconnect mounted in electrical contact with the first electrical connector and the second electrical connector, the interconnect including a loop, wherein the loop includes a first straight segment, a second straight segment including a first end and a second end, and a third straight segment, wherein the second straight segment is mounted to the first straight segment at the first end to form a first corner, and the second straight segment is mounted to the third straight segment at the second end to form a second corner; and
a magnetic field detector located in an interior of the loop of the interconnect, wherein the magnetic field detector is located to detect a current flowing in the interconnect when the current flows in the interconnect.

8. The device of claim 7, wherein the magnetic field detector is located to detect the current flowing in the interconnect when the current flows in the interconnect based on a value of a 5% flat bandwidth and a value of a magnetic field strength of a magnetic field generated when the current flows in the interconnect.

9. The device of claim 7, wherein the device further comprises a conditioning circuit to which the magnetic field detector is electrically connected, the conditioning circuit configured to measure the current.

10. The device of claim 7, wherein the loop has a triangular shape.

11. The device of claim 7, wherein the magnetic field detector is located adjacent the first corner or adjacent the second corner.

12. The device of claim 7, wherein magnetic field detector is located adjacent a center of the second straight segment.

13. A device comprising:
an interconnect mounted in electrical contact with a first electrical connector and a second electrical connector, the interconnect including a loop, wherein the loop includes a curved segment;
a magnetic field detector located in an interior of the loop adjacent to the curved segment of the loop of the interconnect, wherein the magnetic field detector is located to detect a current flowing in the interconnect when the current flows in the interconnect; and
a conditioning circuit to which the magnetic field detector is electrically connected, the conditioning circuit configured to measure the current.

14. The device of claim 13, wherein the magnetic field detector is located to detect the current flowing in the interconnect when the current flows in the interconnect based on a value of a 5% flat bandwidth and a value of a magnetic field strength of a magnetic field generated when the current flows in the interconnect.

15. The device of claim 13, wherein the loop further includes a plurality of curved segments that are each mounted between two straight segments, wherein the curved segment is one of the plurality of curved segments.

16. The device of claim 13, wherein the interconnect further includes a first straight segment, a first curved segment including a first end and a second end, a second straight segment, a second curved segment including a first end and a second end, wherein the first end of the first curved segment is mounted to the first straight segment and the second end of the first curved segment is mounted to a first end of the loop, wherein the first end of the second curved segment is mounted to the second straight segment and the second end of the second curved segment is mounted to a second end of the loop.

17. The device of claim 16, wherein the curved segment extends from the first end of the loop to the second end of the loop.

18. The device of claim 16, wherein the loop further includes a third straight segment and a fourth straight segment mounted on either side of the curved segment, wherein the third straight segment is further mounted to the second end of the first curved segment and the fourth straight segment is further mounted to the second end of the second curved segment.

19. The device of claim 13, further comprising a substrate comprising a heat sink layer, an isolation substrate, and the first electrical connector, wherein the first electrical connector is mounted on the isolation substrate and the isolation substrate is mounted on the heat sink layer.

20. The device of claim 13, further comprising a printed circuit board comprising a plurality of electrical components and the second electrical connector in electrical connection with at least one of the plurality of electrical components.

* * * * *